(12) United States Patent
Edahiro

(10) Patent No.: US 7,525,844 B2
(45) Date of Patent: Apr. 28, 2009

(54) SEMICONDUCTOR MEMORY DEVICE WITH MOS TRANSISTORS EACH HAVING FLOATING GATE AND CONTROL GATE AND METHOD OF CONTROLLING THE SAME

(75) Inventor: Toshiaki Edahiro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 11/445,302

(22) Filed: Jun. 2, 2006

(65) Prior Publication Data
US 2007/0104002 A1    May 10, 2007

(30) Foreign Application Priority Data
Nov. 8, 2005    (JP)    .............................. 2005-323602

(51) Int. Cl.
G11C 11/34    (2006.01)
(52) U.S. Cl. .............. 365/185.21; 365/207; 365/189.15
(58) Field of Classification Search ............ 365/185.21, 365/207, 189.15
See application file for complete search history.

(56) References Cited

U.S. PATENT DOCUMENTS

| 5,388,078 | A * | 2/1995 | Arakawa | 365/203 |
|---|---|---|---|---|
| 6,009,024 | A * | 12/1999 | Hirata et al. | 365/190 |
| 6,426,905 | B1 * | 7/2002 | Dennard et al. | 365/204 |
| 6,703,870 | B2 | 3/2004 | Chung et al. | |
| 6,819,584 | B2 * | 11/2004 | Noh | 365/145 |
| 2002/0186593 | A1 * | 12/2002 | Takano et al. | 365/185.21 |
| 2003/0109096 | A1 * | 6/2003 | Otani et al. | 438/200 |
| 2003/0197551 | A1 * | 10/2003 | Hamamoto et al. | 327/540 |
| 2004/0027850 | A1 * | 2/2004 | Kang | 365/145 |
| 2004/0223392 | A1 * | 11/2004 | Ikehashi | 365/205 |
| 2005/0185474 | A1 * | 8/2005 | Atwood et al. | 365/189.01 |

OTHER PUBLICATIONS

U.S. Appl. No. 11/445,302, filed Jun. 2, 2006, Edahiro.
U.S. Appl. No. 11/613,492, filed Dec. 20, 2006, Edahiro.
Wei-Hua Liu, et al. "A 2-Transistor Source-select (2TS) Flash EEPROM for 1.8V-Only Applications", Nonvolatile Semiconductor memory Workshop 4.1 (NVSMW), Feb. 1997, pp. 1-3.
Rino Micheloni, et al. "The Flash Memory Read Path: Building Blocks and Critical Aspects", Proceedings of the IEEE, vol. 91, No. 4, Apr. 2003, pp. 537-553.

* cited by examiner

*Primary Examiner*—Hoai V Ho
*Assistant Examiner*—Anthan T. Tran
(74) *Attorney, Agent, or Firm*—Oblon, Spivak, McClelland, Maier & Neustadt, P.C.

(57) ABSTRACT

A semiconductor memory device includes a memory cell array, first bit lines, second bit lines, first sense amplifiers and second sense amplifiers. The memory cell array includes memory cells arranged in a matrix. The first bit line connects commonly the memory cells in a same column. The second bit line connects commonly two or more of the first bit lines. The first sense amplifier is provided for the second bit line and controls not only the connection between the second bit lines and the first bit lines but also the potential on the second bit lines according to the data read from the memory cells onto the first bit lines. The second sense amplifier precharges the first bit line via the second bit line and the first sense amplifier and, when reading the data from the memory cells, amplifies the potential on the second bit lines.

22 Claims, 26 Drawing Sheets

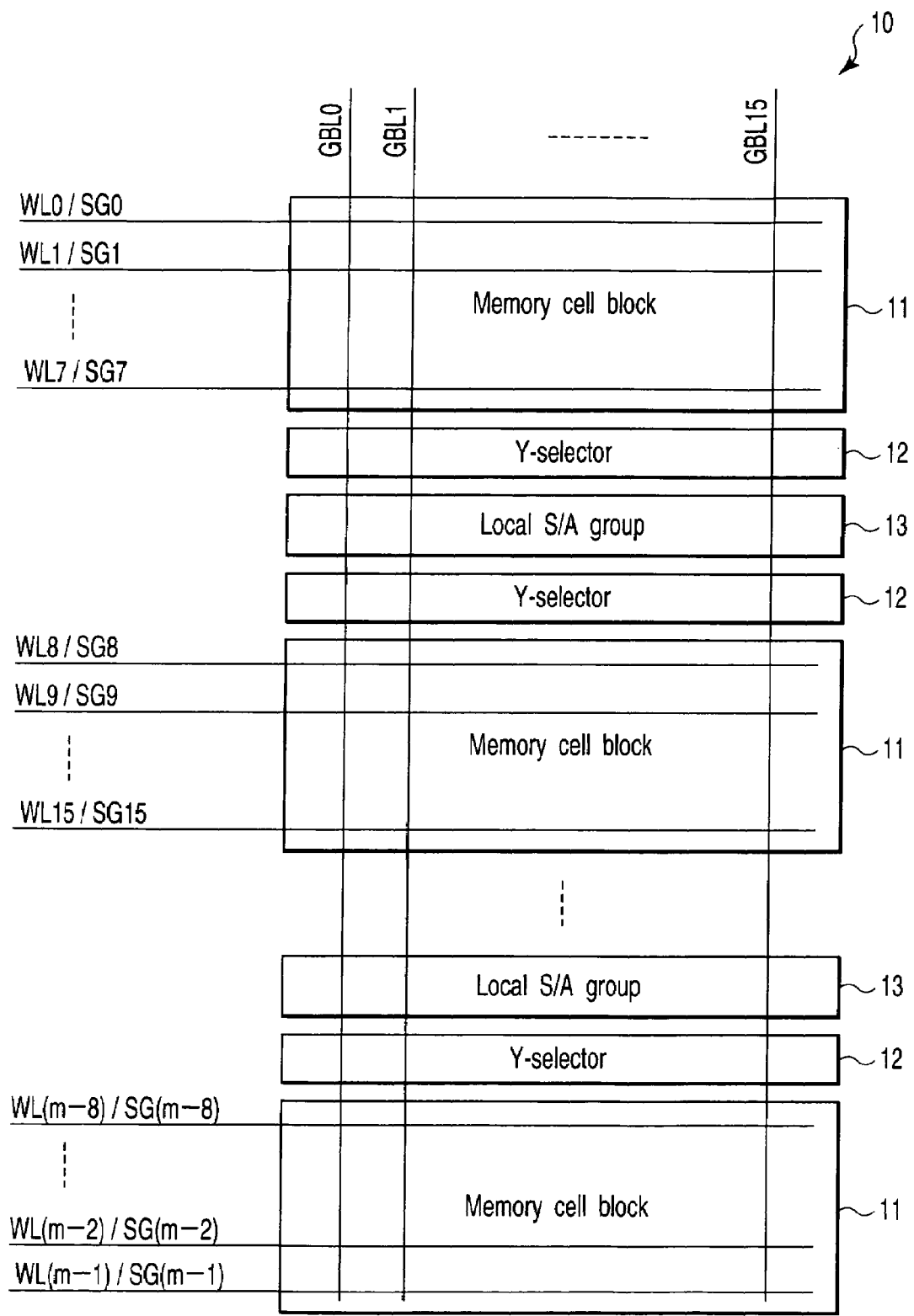
F I G. 2

Write operation

Erase operation

SEMICONDUCTOR MEMORY DEVICE WITH MOS TRANSISTORS EACH HAVING FLOATING GATE AND CONTROL GATE AND METHOD OF CONTROLLING THE SAME

CROSS-REFERENCE TO RELATED APPLICATIONS

This application is based upon and claims the benefit of priority from prior Japanese Patent Application No. 2005-323602, filed Nov. 8, 2005, the entire contents of which are incorporated herein by reference.

BACKGROUND OF THE INVENTION

1. Field of the Invention

This invention relates to a semiconductor memory device and a controlling method of the semiconductor memory device. More particularly, this invention relates to a nonvolatile semiconductor memory device including MOS transistors, each having a floating gate and a control gate.

2. Description of the Related Art

One known semiconductor memory reading method is to set a bit line to a specific precharge potential and determine the data, depending on whether or not the bit line is discharged as a result of reading the data from a memory cell. This method has also been applied to a flash memory. A flash memory has been disclosed in, for example, Wei-Hua Liu, "A 2-Transistor Source-select (2TS) Flash EEPROM for 1.8-V-Only Application," Non-Volatile Semiconductor Memory Workshop 4.1, 1997. Hereinafter, this type of flash memory is referred to as a 2Tr flash memory.

Furthermore, in one known data sensing method, a local sense amplifier is combined with a global sense amplifier. In this method, one local sense amplifier is provided for every two or more local bit lines. A global bit line is provided for each local sense amplifier. A global sense amplifier is provided for every two or more global bit lines. The local bit line is precharged by the local sense amplifier.

In the above method, however, not only the local sense amplifier corresponding to the selected global bit line but also the local sense amplifiers corresponding to the unselected global bit lines are activated. Therefore, the unnecessary local bit lines are also precharged. As a result, a large current is supplied to the memory cell array in precharging, which leads to high power consumption.

BRIEF SUMMARY OF THE INVENTION

A semiconductor memory device according to an aspect of the present invention includes:

a memory cell array in which memory cells are arranged in a matrix;

a plurality of first bit lines each of which connects commonly the memory cells in a same column;

a plurality of second bit lines each of which connects commonly two or more of the first bit lines;

first sense amplifiers which are provided for the second bit lines in a one-to-one correspondence and which controls not only the connection between the second bit lines and the first bit lines but also the potential on the second bit lines according to the data read from the memory cells onto the first bit lines; and second sense amplifiers which precharge the first bit lines via the second bit lines and the first sense amplifiers and, when reading the data from the memory cells, amplify the potential on the second bit lines.

A method of controlling a semiconductor memory device according to an aspect of the present invention, the device including bit lines hierarchized into first bit lines and second bit lines, memory cells connected to the first bit lines, a first sense amplifier provided for every two or more of the first bit lines, the second bit lines provided for the first sense amplifiers in a one-to-one correspondence, and a second amplifier provided for every two or more of the second bit lines, the method including:

connecting any one of the second bit lines to the second sense amplifier;

causing the first sense amplifier to connect the second bit line to any one of the first bit lines;

causing the second sense amplifier to precharge the fist bit line via the second bit line and the first sense amplifier;

causing the first sense amplifier to disconnect the second bit line from the first bit line after the precharging;

reading data from the memory cell onto the precharged first bit line after the second bit line and the first bit line are disconnected from each other; and causing the first sense amplifier to vary the potential on the second bit line when "1" data is read onto the first bit line and causing the first sense amplifier to keep the potential on the second bit line at the potential at the time of the precharging when "0" data is read onto the first bit line.

A memory card according to an aspect of the present invention includes a semiconductor memory device, the device including:

a memory cell array in which memory cells are arranged in a matrix;

a plurality of first bit lines each of which connects commonly the memory cells in a same column;

a plurality of second bit lines each of which connects commonly two or more of the first bit lines;

first sense amplifiers which are provided for the second bit lines in a one-to-one correspondence and which controls not only the connection between the second bit lines and the first bit lines but also the potential on the second bit lines according to the data read from the memory cells onto the first bit lines; and second sense amplifiers which precharge the first bit lines via the second bit lines and the first sense amplifiers and, when reading the data from the memory cells, amplify the potential on the second bit lines.

BRIEF DESCRIPTION OF THE SEVERAL VIEWS OF THE DRAWING

FIG. 2 is a block diagram of a memory cell array included in a 2Tr flash memory according to the first embodiment;

DETAILED DESCRIPTION OF THE INVENTION

Figure 1:
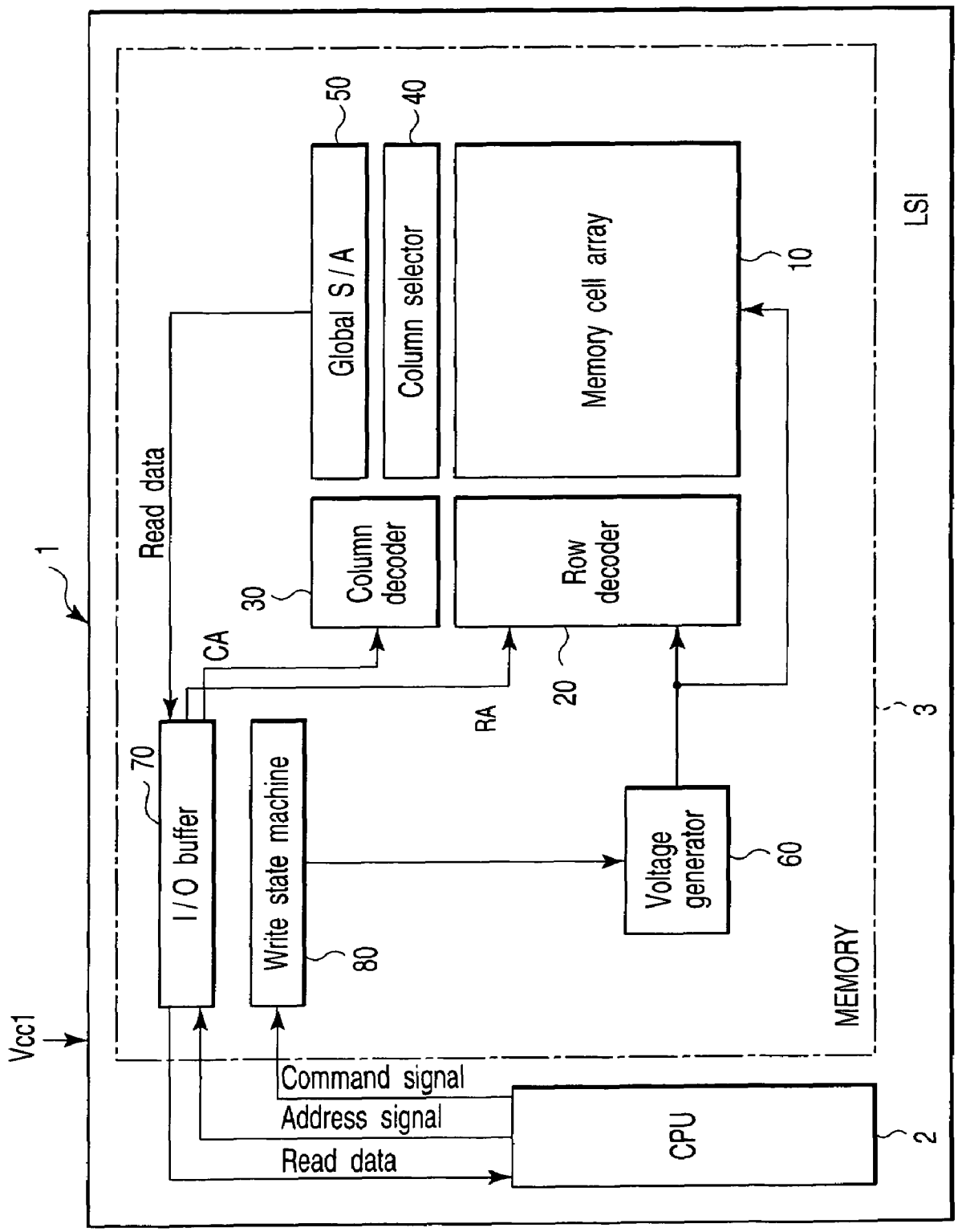
FIG. 1 is a block diagram of a system LSI according to a first embodiment of the present invention.

A semiconductor memory device according to a first embodiment of the present invention and its control method will be explained using FIG. 1. FIG. 1 is a block diagram of a system LSI according to the first embodiment.

As shown in FIG. 1, a system LSI 1 comprises a CPU 2 and a 2Tr flash memory 3. The CPU 2 exchanges data with the flash memory 3. The flash memory 3 includes a memory cell array 10, a row decoder 20, a column decoder 30, a column selector 40, a global sense amplifier 50, a voltage generator circuit 60, an input/output buffer 70, and a write state machine 80. A voltage of Vcc1 (1.2 to 1.65 V) is externally supplied to the LSI 1.

FIG. 2 is a block diagram of the memory cell array 10. As shown in FIG. 2, the memory cell array 10 includes a plurality of memory cell blocks 11, a plurality of Y-selectors 12, and a plurality of local sense amplifier groups 13. The Y-selectors 12 are provided for the memory cell blocks 11 in a one-to-one correspondence. A local sense amplifier group 13 is provided for every two memory cell blocks 11. Then, for example, 16 global bit lines GBL0 to GBL15 are provided so as to connect a plurality of memory cell blocks 11 to one another. In the memory cell array 10, an m number of word lines WL0 to WL(m-1) and an m number of select gate lines SG0 to SG(m-1) are provided in a direction perpendicular to the global bit lines GBL0 to GBL15. In each of the memory cell blocks 11, 8 word lines and 8 select gate lines are provided. Therefore, in one memory cell block 11, word lines WL0 to WL7 and select gate lines SG0 to SG7 are provided. In its adjacent memory cell block 11, word lines WL8 to WL15 and select gate lines SG8 to SG15 are provided. The number of global bit lines is not limited to 16. For instance, it may be 16 or 32 according to need. Similarly, the number of word lines and the number of select gate lines provided in each memory cell block 11 are not limited to 8. For instance, they may be 16 or 32.

Figure 3:
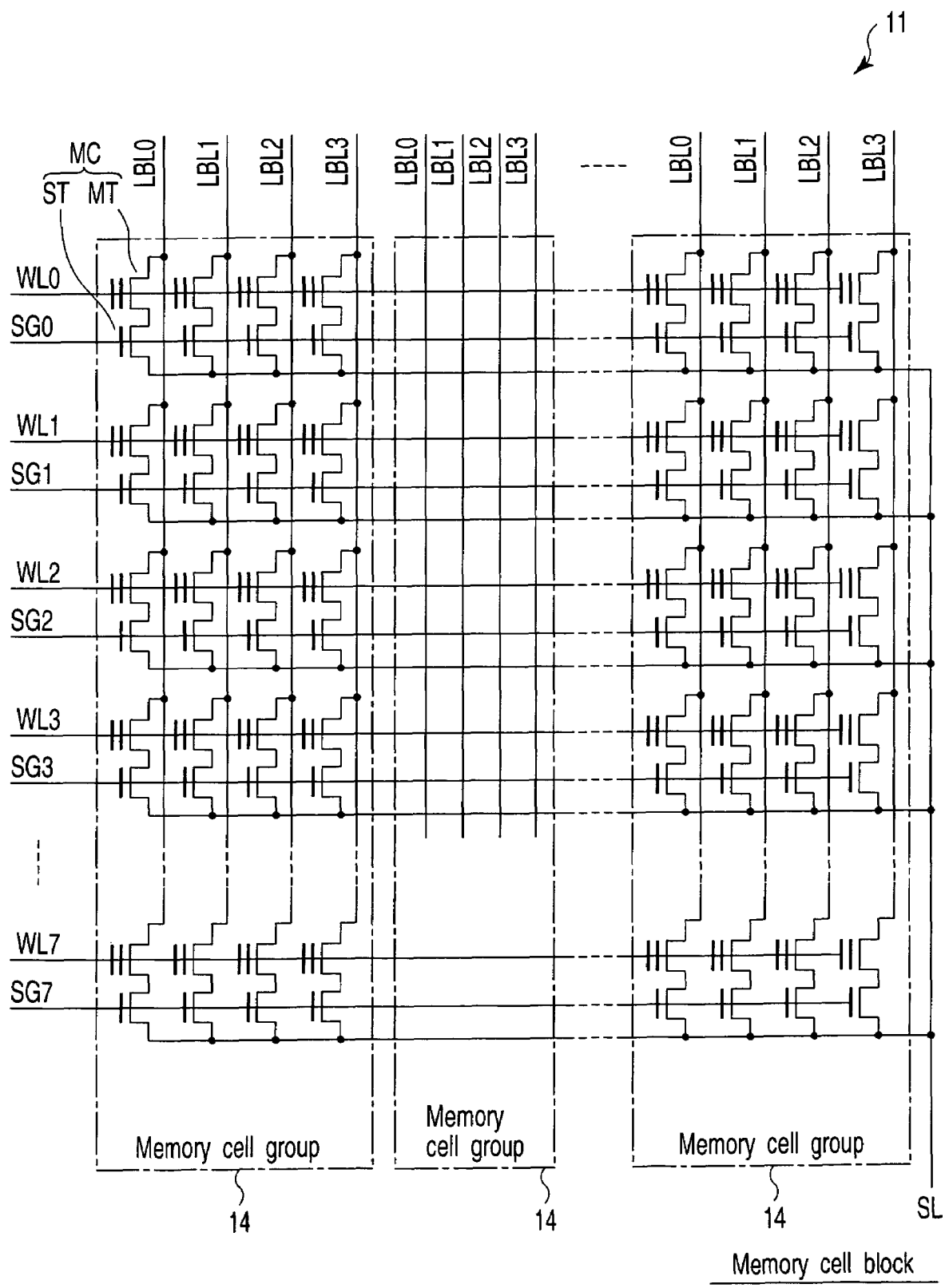
FIG. 3 is a circuit diagram of a memory cell block included in the 2Tr flash memory according to the first embodiment.

Next, the configuration of a memory cell block 11 will be explained using FIG. 3. FIG. 3 is a circuit diagram of a memory cell block 11, especially showing a memory cell block 11 including word lines WL0 to WL7 and select gate lines SG0 to SG7. The configuration of each of the other memory cell blocks 11 is the same as that of FIG. 3, except for the allocated word lines and select gate lines.

As shown in FIG. 3, the memory cell block 11 has as many memory cell groups 14 as there are global bit lines. A memory cell group 14 has (8×4) memory cells MC. The memory cells MC are 2Tr flash memory cells. Each of the memory cells MC includes a memory cell transistor MT and a select transistor ST, which have their current paths connected in series with each other. The memory cell transistor MT has a stacked gate structure that includes a floating gate formed on a semiconductor substrate with a gate insulating film interposed therebetween and a control gate formed on the floating gate with an inter-gate insulating film interposed therebetween. The floating gates are isolated in their respective every memory cell transistor MT. The source region of the memory cell transistor MT is connected to the drain region of the select transistor ST.

The control gates of the memory cell transistors MT in a same row are connected commonly to any one of word lines WL0 to WL7. The gates of the select transistors in a same row are connected commonly to any one of select gate lines SG0 to SG7. The drains of the memory cell transistors MT in a same column are connected commonly to any one of local bit lines LBL0 to LBL3.

Local bit lines LBL0 to LBL3 are provided for each memory cell group and are disconnected electrically from one another. The word lines and select gate lines connect all of the memory cell groups 11 in the same memory cell block 11 to one another. Then, the sources of all of the select transistors ST in the same memory cell block 11 are connected commonly to the source line SL.

Accordingly, in the example of FIG. 3, since the number of global bit lines is 16, 16 memory groups 14 are provided. Thus, the number of each of the local bit lines LBL0 to LBL3 is 16. The number of local bit lines included in one memory cell group 14 is not limited to 4 and may be 2 or 8.

Figure 4:
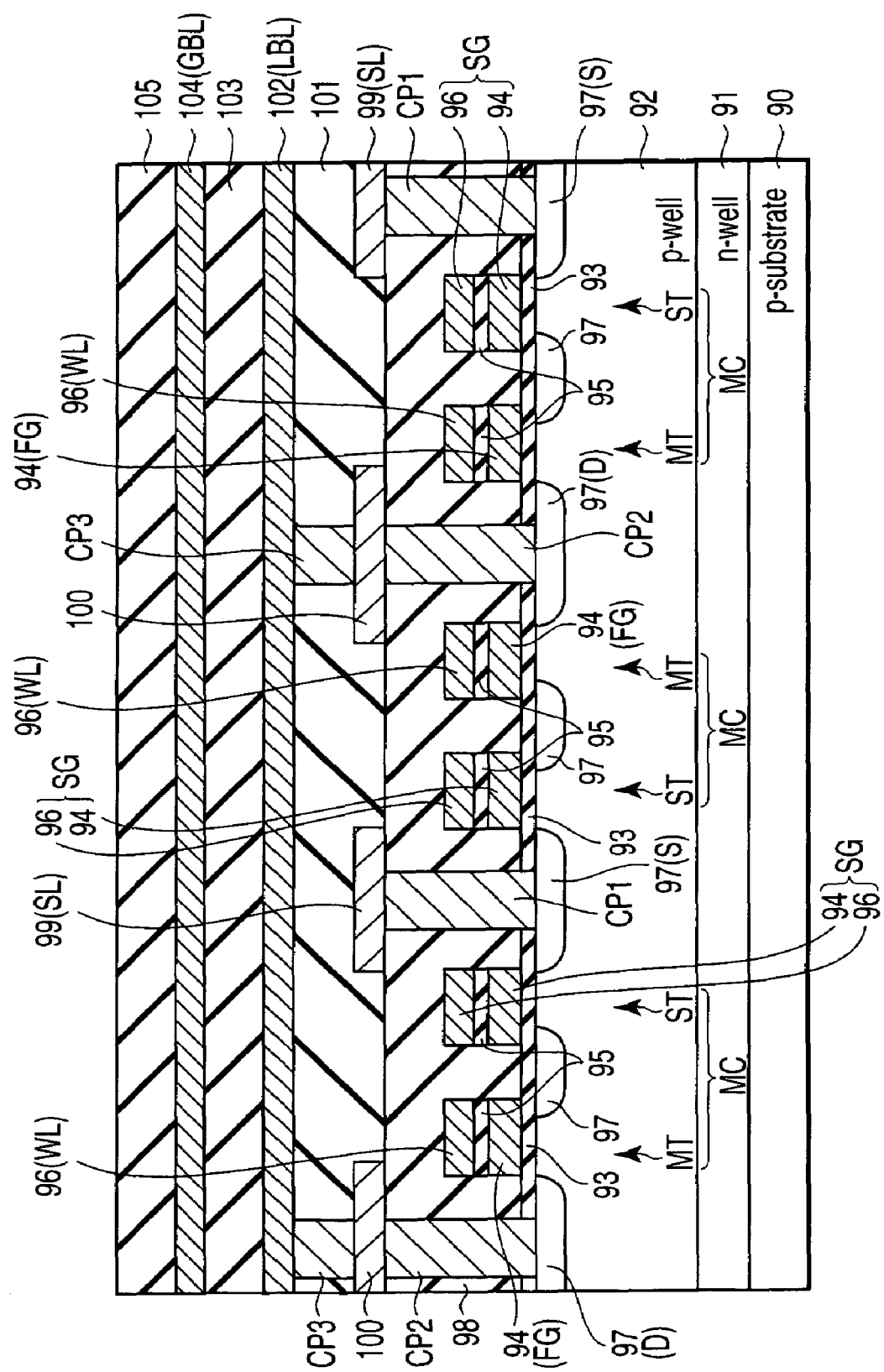
FIG. 4 is a sectional view of a memory cell block included in the 2Tr flash memory according to the first embodiment.

The sectional configuration of the memory cell block 11 will be explained using FIG. 4. FIG. 4 is a sectional view of the memory cell block 11 taken along a global bit line. As shown in FIG. 4, an n-well region 91 is formed at the surface of a p-type semiconductor substrate 90. A p-well region 92 is formed at the surface of the n-well region 91. On the p-well region 92, a gate insulating film 93 is formed. On the gate insulating film 93, the gate electrodes of a memory cell transistor MT and a select transistor ST are formed. Each of the gate electrodes of the memory cell transistor MT and select transistor ST includes a polysilicon layer 94 formed on the gate insulating film 93, an inter-gate insulating film 95 formed on the polysilicon layer 94, and a polysilicon layer 96 formed on the inter-gate insulating film 95. The inter-gate insulating film 95 is made of, for example, a silicon oxide film, or an ON film, NO film, or ONO film having a stacked structure of a silicon oxide film and a silicon nitride film.

In a memory cell transistor MT, the polysilicon layers 94 function as floating gates (FG). The polysilicon layers 96, which are connected to each other in a direction perpendicular to the global bit line, function as control gates (word lines WL).

In a select transistor ST, the polysilicon layers 94, 96 are connected to each other in the direction of word line. The polysilicon layers 94, 96 function as select gate lines SG. Only the polysilicon layers 94 may function as select gate lines. In this case, the potential of the polysilicon layer 96 of the select transistor ST is set at a constant potential or in the floating state.

At the surface of the p-well region 92 between gate electrodes, an n$^+$ impurity diffused layer 97 is formed. The impurity diffused layer 97, which is shared by adjacent transistors, functions as a source (S) or a drain (D).

On the p-well region 92, an interlayer insulating film 98 is formed so as to cover the memory cell transistor MT and select transistor ST. In the interlayer insulating film 98, a contact plug CP1 reaching the impurity diffused layer (or source) 97 shared by two select transistors ST, ST is formed. On the interlayer insulating film 98, a metal wiring layer 99 connected to the contact plug CP1 is formed. The metal wiring layer 99 functions as a source line SL. In the interlayer insulating film 98, a contact plug CP2 reaching the impurity diffused layer (or drain) 97 shared by two memory cell transistors MT, MT is formed. On the interlayer insulating film 98, a metal wiring layer 100 connected to the contact plug CP2 is formed.

On the interlayer insulating film 98, an interlayer insulating film 101 is formed so as to cover the metal wiring layers 99, 100. In the interlayer insulating film 101, a contact plug CP3 reaching the metal wiring layer 100 is formed. On the interlayer insulating film 101, a metal wiring layer 102 connected commonly to a plurality of contact plugs CP3 is formed. The metal wiring layer 102 functions as a local bit line LBL. On the interlayer insulating film 101, an interlayer insulating film 103 is formed so as to cover the metal wiring layer 102. On the interlayer insulating film 103, a metal wiring layer 104, which functions as a global bit line GBL, is formed. Moreover, an interlayer insulating film 105 is formed so as to cover the metal wiring layer 104.

Figure 5:
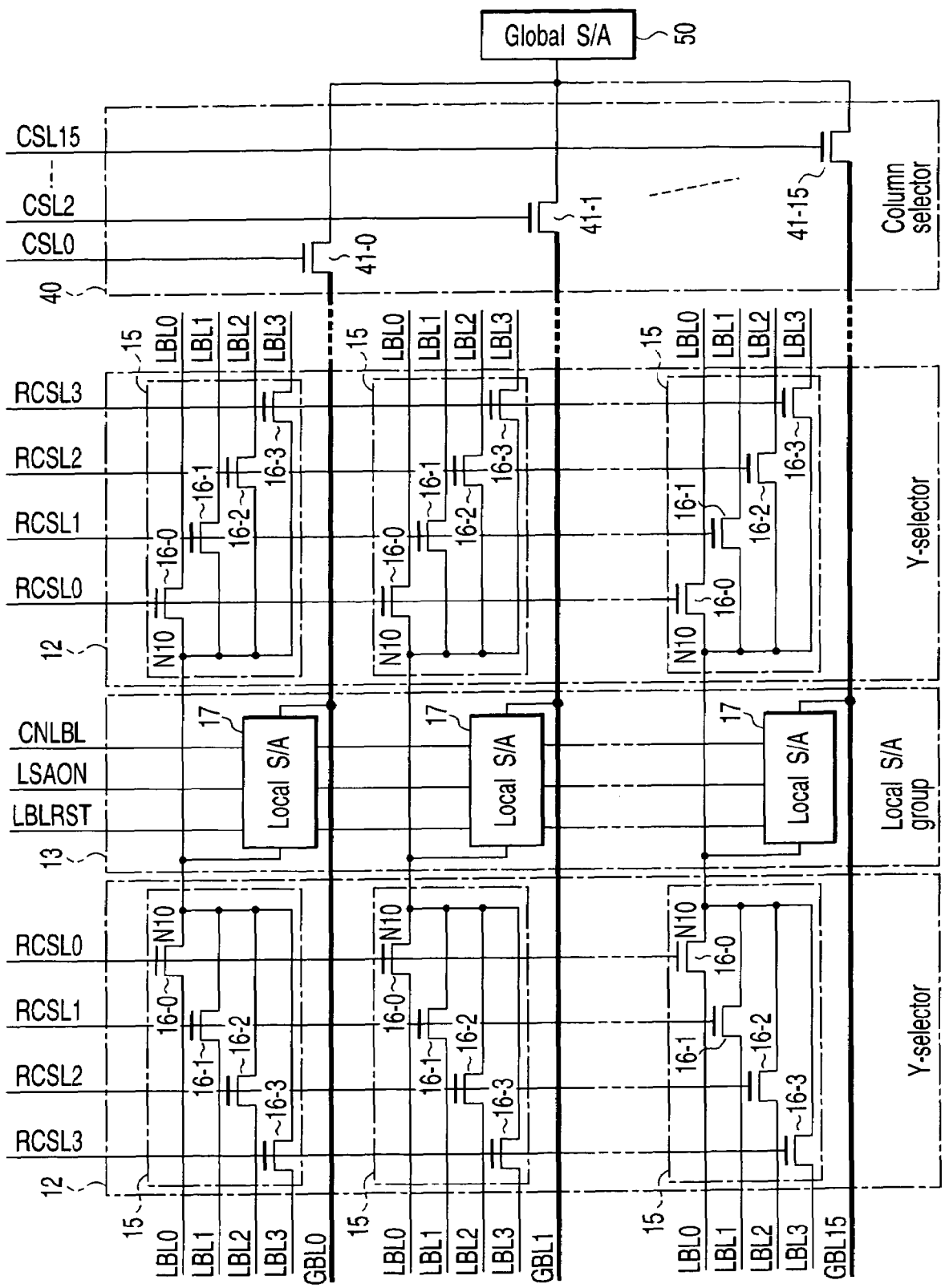
FIG. 5 is a circuit diagram of a Y-selector, a local sense amplifier group, a column selector, and a global sense amplifier included in the 2Tr flash memory according to the first embodiment.

Next, using FIG. 5, the configuration of the Y-selector 12, local sense amplifier group 13, and column selector 40 will be explained. FIG. 5 is a circuit diagram of the Y-selector 12, local sense amplifier group 13, and column selector 40. First, the Y-selector 12 will be explained.

As described above, the Y-selectors 12 are provided for the memory cell blocks 11 in a one-to-one correspondence. As shown in FIG. 5, the Y-selector 12 includes a read select circuit 15 provided for each memory cell group included in the corresponding memory cell block 11. Specifically, the Y-selector 12 includes a read select circuit 15 provided for a set of local bit lines LBL0 to LBL3 in the corresponding memory cell block 11. In other words, the read select circuits 15 are provided for the global bit lines in a one-to-one correspondence. Therefore, when there are 16 bit global bit lines, the Y-selector 12 has 16 read select circuits 15. Each of the read select circuits 15 has n-channel MOS transistors 16-0 to 16-3 provided for each of the local bit lines LBL0 to LBL3. One end of a current path of each of the MOS transistors 16-0 to 16-3 is connected to the local bit lines LBL0 to LBL3 in the corresponding memory cell group 14, respectively. The other ends of the current path of the MOS transistors 16-0 to 16-3 are connected to one another at a common junction node. Hereinafter, the common junction node is referred to as node N10. Nodes 10 of the adjacent Y-selectors 12 corresponding to the same global bit line GBL are connected to one another. The gates of the MOS transistors 16-0 to 16-3 are connected commonly to the read column select lines RCSL0 to RCSL3, respectively, in each Y-selector 12.

Next, the local sense amplifier group 13 will be explained. As described above, one local sense amplifier group 13 is provided for every two adjacent memory cell blocks, that is, every two Y-selectors 12. As shown in FIG. 5, the local sense amplifier group 13 includes local sense amplifiers 17 provided for nodes N10 in the corresponding Y-selector 12 in a one-to-one correspondence. That is, there are as many local sense amplifiers 17 as there are global bit lines. The local sense amplifier 17 connects the corresponding node N10 to any one of the global bit lines GBL0 to GBL15. Thus, each of the global bit lines GBL0 to GBL15 is connected to node N10 by the corresponding local sense amplifier 17. Node N10 is connected to any one of the local bit lines LBL0 to LBL3 by the read select circuit 15. The local sense amplifiers 17 included in the same local sense amplifier group 13 are connected commonly to the same reset signal line LBLRST, the same sense signal line LSAON, and the same connect signal line CNLBL.

Next, the column selector 40 will be explained. The column selector 40 selects any one of the global bit lines GBL0 to GBL15. As shown in FIG. 5, the column selector 40 includes n-channel MOS transistors 41-0 to 41-15 provided for global bit lines GBL0 to GBL15 in a one-to-one correspondence. One end of the current path of each of the MOS transistors 41-0 to 41-15 is connected to global bit lines GBL0 to GBL15, respectively. The other ends of the MOS transistors 41-0 to 41-15 are connected to the global sense amplifier 50. The gates of the MOS transistors 41-0 to 41-15 are connected to column select lines CSL0 to CSL15, respectively.

Figure 6:
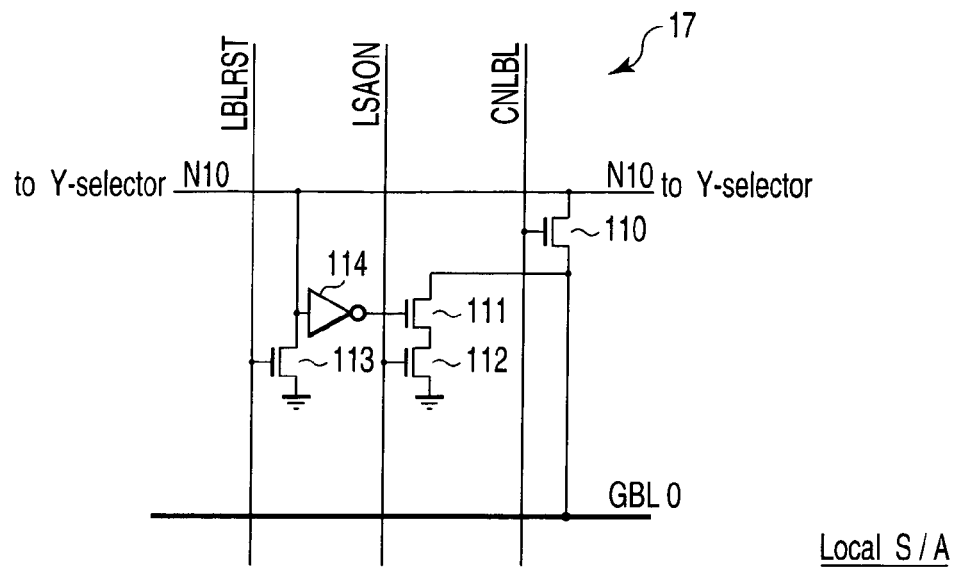
FIG. 6 is a circuit diagram of a local sense amplifier included in the 2Tr flash memory according to the first embodiment.

FIG. 6 is a circuit diagram showing a configuration of the local sense amplifier 17. As shown in FIG. 6, the local sense amplifier 17 includes n-channel transistors 110 to 113 and an inverter 114. The MOS transistor 110 has its drain connected to node 10, its source connected to a global bit line GBL, and its gate connected to a connect signal line CNLBL. The MOS transistor 111 has its drain connected to the source of the MOS transistor 110 (global bit line), its source connected to the drain of the MOS transistor 112, and its gate connected to the output node of the inverter 114. The MOS transistor 112 has its source connected to the ground and its gate connected to a sense signal line LSAON. The MOS transistor 113 has its drain connected to node 10 and the input node of the inverter 14, its source connected to the ground, and its gate connected to a reset signal line LBLRST.

Setting back to FIG. 1, the explanation will be continued. In a write operation, the row decoder 20 selects any one of the word lines WL0 to WL(m-1) on the basis of a row address signal and supplies a voltage to the selected word line. Moreover, in a read operation, the row decoder 20 selects any one of the select gate lines SG0 to SG(m-1) on the basis of a row address signal RA and supplies a voltage to the selected select gate line. Furthermore, the row decoder 20 supplies a voltage to a semiconductor substrate (p-well region 92) in which memory cells have been formed.

The column decoder 30, in a read operation, selects any one of the read column select lines RCSL0 to RCSL3 corresponding to a certain memory cell block 11 on the basis of a column address signal CA and supplies a voltage to the selected read column select line. In addition, the column decoder 30 selects the signal lines LBLRST, LSAON, and CNLBL connected to the local sense amplifier 17 corresponding to the memory cell block 11 and supplies a voltage to these selected lines. Moreover, the column decoder 30 selects any one of the column select lines CSL0 to CSL15 and supplies a voltage to the selected line.

The column selector 40 connects any one of the global bit lines GBL0 to GBL15 to the global sense amplifier 50 according to the voltage supplied to the column select lines CSL0 to CSL15.

The global sense amplifier 50 not only precharges the global bit lines and the local bit lines in a read operation but also amplifies the read-out data.

The voltage generator circuit 60 has a positive charge pump circuit and a negative charge pump circuit. On the basis of an externally applied voltage Vcc1, the voltage generator circuit 60 generates a positive voltage VPP (e.g., 12 V) and a negative voltage VBB (e.g., -7 V). The positive voltage VPP and negative voltage VBB are supplied to the row decoder 20, memory cell array 10, and others.

The input/output buffer 70 holds the read-out data amplified at the global sense amplifier 50 and outputs the data to the CPU 2. The input/output buffer 70 further holds the write data and address signal received from the CPU 2. Then, the input/output buffer 70 supplies a column address signal CA to the column decoder 30 and a row address signal RA to the row decoder 20.

On the basis of an instruction signal given by the CPU2, the write state machine 80 controls the operation of each circuit included in the flash memory 3, performs timing control of data writing, erasing, and reading, and executes a specific algorithm determined for each operation.

Next, the 2Tr flash memory configured as described above will be explained. To simplify the operation, only the voltage relationship in the memory cell block 11 connected to word line WL0 will be explained. Here, a state where electrons are injected into the floating gate of a memory cell MC and the threshold voltage of the memory cell MC is positive is defined as "0" data, whereas a state where no electron is injected into the floating gate and the threshold voltage of the memory cell MC is negative is defined as "1" data.

<Write Operation>

Figure 7:
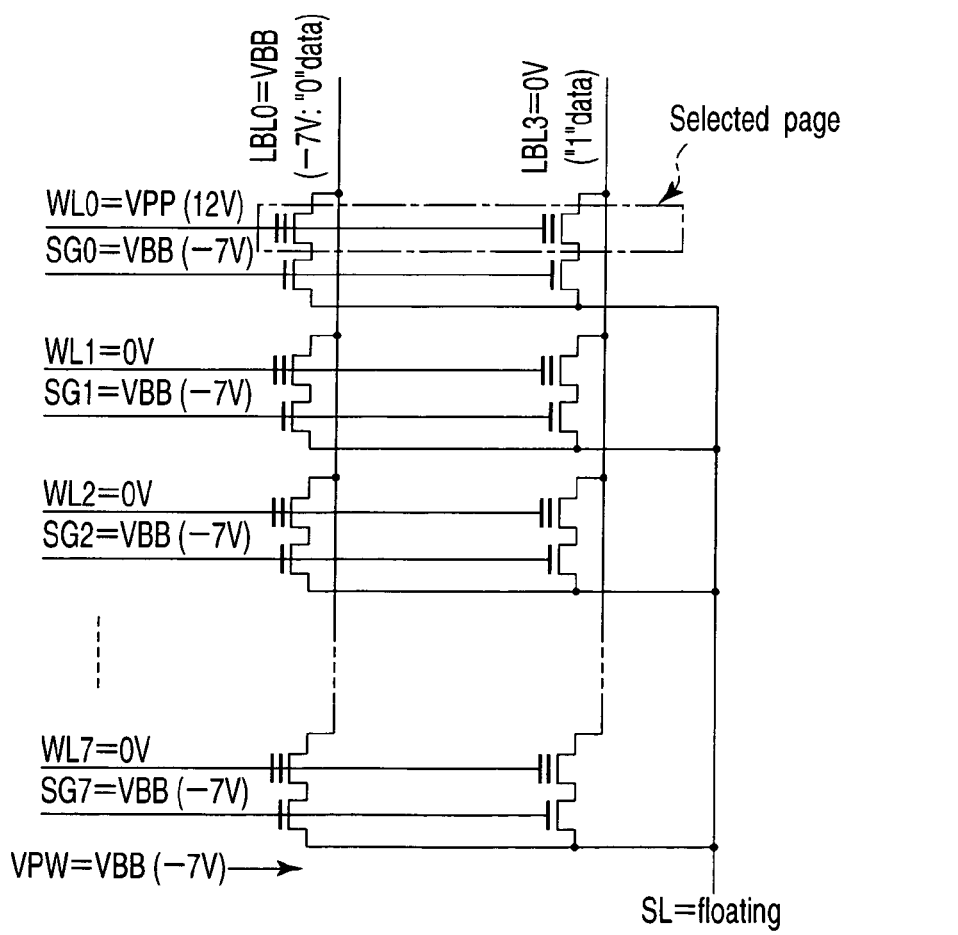
FIG. 7 is a circuit diagram of a memory cell group included in the 2Tr flash memory according to the first embodiment, showing a write operation.

First, the operation of writing data will be explained using FIG. 7. FIG. 7 is a circuit diagram of the memory cell block 11 in a write operation. Data is written simultaneously into a plurality of memory cells (which are referred to as one page) connected commonly to any one of the word lines. In one memory cell group, data may be written into all the memory cells connected to the local bit lines LBL0 to LBL3. Alternatively, data may be written into only the memory cells connected to any one or two of the local bit lines. FIG. 7 shows a case where "0" data is written into the memory cell MC connected to word line WL0 and local bit line LBL0 and "1" data is written into the memory cell MC connected to word line WL0 and local bit line LBL3.

To write data, the voltage generator circuit 60 generates the positive voltage VPP and negative voltage VBB according to an instruction given by the write state machine 80.

Moreover, the write data given by the CPU 2 is supplied to the local bit lines LBL0, LBL3. The negative voltage VBB is applied to the local bit line LBL0 connected to the memory cell MC into which "0" data is to be written, whereas 0 V is applied to the local bit line LBL3 connected to the memory cell MC into which "1" data is to be written.

Then, the row decoder 20 selects word line WL0 and applies the positive voltage VPP to word line WL0. To the unselected word lines WL1 to WL7, 0 V is applied. Furthermore, the row decoder 20 not only applies the negative voltage VBB to all of the select gate lines SG0 to SG7 but also sets at VBB the potential VPW of the p-well region 92 in which the memory cells have been formed. The potential of the source line SL is brought into the floating state.

As a result, in the memory cell transistor MT connected to local bit line LBL0 and word line WL0, since the potential difference between the gate and channel is sufficient (VPP−VBB=19 V), electrons are injected into the floating gate by FN tunneling, with the result that the threshold value of the memory cell MC changes from negative to positive. That is, "0" data is written. On the other hand, in the memory cell transistor connected to local bit line LBL3 and word line WL0, since the potential difference between the gate and channel is insufficient (VPP=12 V), no electron is injected into the floating gate, with the result that the memory cell MC keeps the negative threshold value. That is, "1" data is written.

As described above, data is written simultaneously into one page of memory cell transistors.

<Erase Operation>

Figure 8:
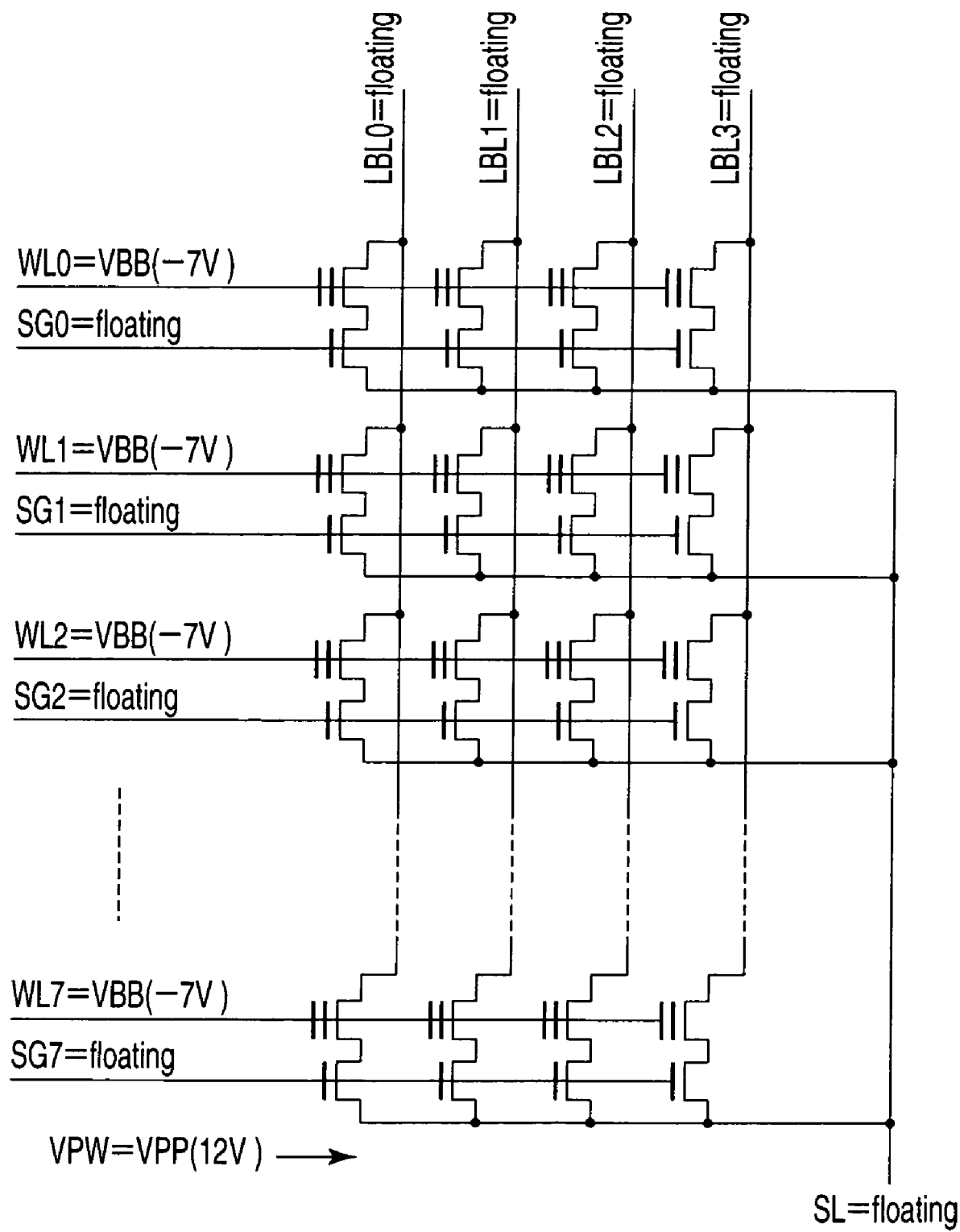
FIG. 8 is a circuit diagram of the memory cell group included in the 2Tr flash memory according to the first embodiment, showing an erase operation.

Next, the operation of erasing data will be explained using FIG. 8. FIG. 8 is a circuit diagram of the memory cell block 11 in an erase operation. The data is erased simultaneously from all of the memory cells which share the p-well region 92. An erase operation is carried out by pulling electrons out of the floating gate by FN tunneling.

To do erasing, the voltage generator circuit 60 generates the positive voltage VPP and negative voltage VBB. Then, the row decoder 20 applies VBB to all the word lines WL0 to WL7, brings all the select gate lines SG0 to SG7 into the electrically floating state, and further supplies the positive voltage as VPW. The source line and all the local bit lines LBL0 to LBL3 are also brought into the electrically floating state.

As a result, the electrons are pulled out of the floating gates of the memory cell transistors MT into the well region 92. This erases the data in all of the memory cells MC connected to the word lines WL0 to WL7, with the result that the threshold voltage becomes negative. In this way, the data is erased simultaneously. The positive voltage VPP may be applied to the select gate lines SG0 to SG7. In this case, the voltage stress applied to the gate insulating film 93 of the select transistor can be suppressed.

<Read Operation>

Figure 9:
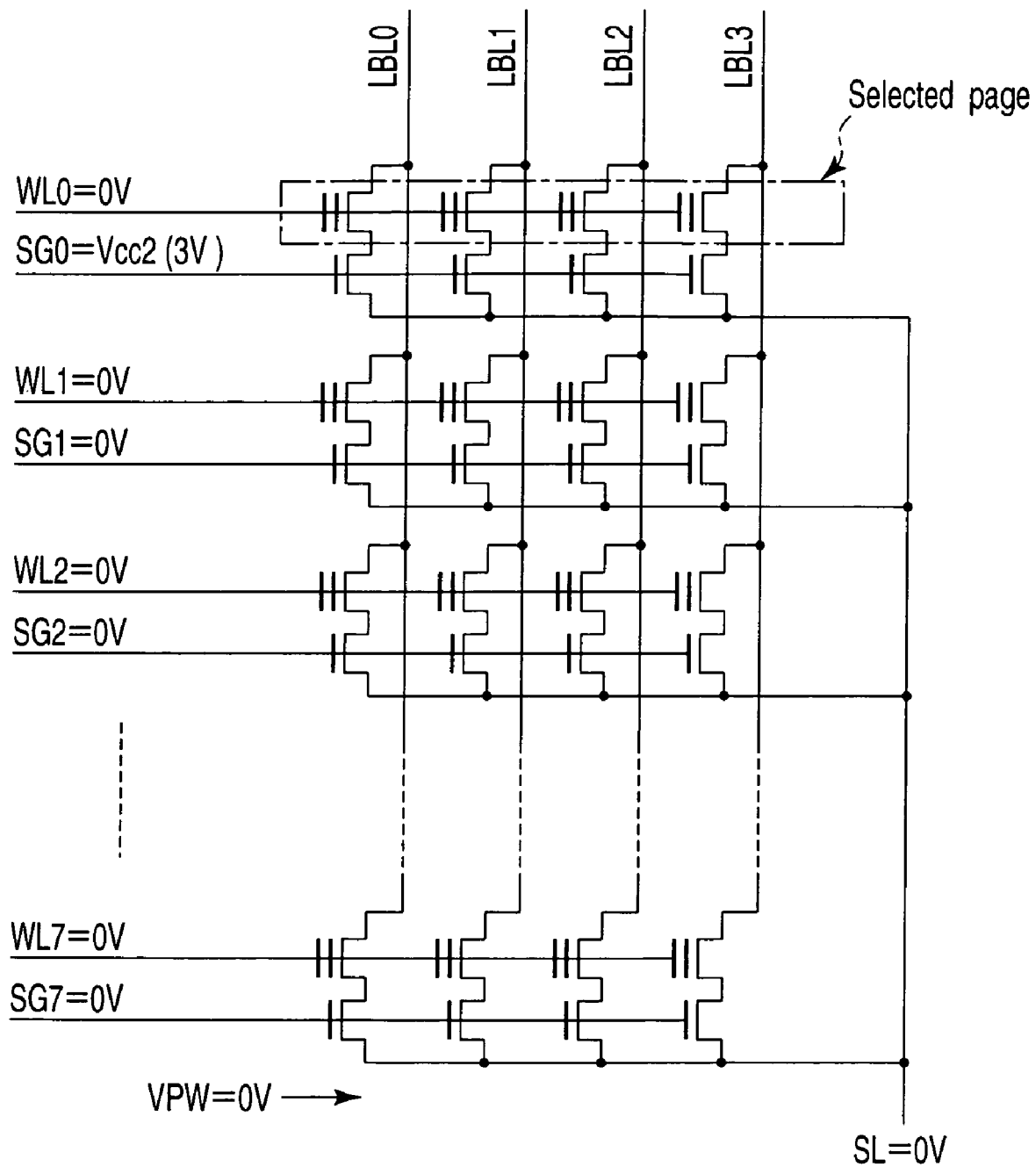
FIG. 9 is a circuit diagram of the memory cell group included in the 2Tr flash memory according to the first embodiment, showing a read operation.

Next, a read operation will be explained using FIG. 9. FIG. 9 is a circuit diagram of the memory cell block 11 in a read operation. In FIG. 9, a case where the data is read from the memory cells connected to word line WL0 will be explained.

First, any one of the local bit lines LBL0 to LBL3 connected to the memory cell MC from which the data is to be read are precharged until a specific precharge potential has been reached. Then, the row decoder 20 selects select gate line SG0 and applies a positive voltage Vcc 2 (e.g., 3 V) to select gate line SG0. The positive voltage Vcc2 may be an externally applied voltage or a voltage generated by the voltage generator circuit 60. All of the word lines WL0 to WL7, the source line SL, and the well potential VPW are set at 0 V.

Then, the select transistor ST connected to select gate line SG0 turns on. Accordingly, if the data written in the memory cell transistor MT connected to selected word line WL0 in the memory cells connected to the precharged local bit line is "1," current will flow from the local bit line to the source line. On the other hand, if the written data is "0," no current will flow. Then, a change in the potential on the local bit line caused by the flowing of current in the memory cell MC is amplified by the local sense amplifier, which causes the charge on the global bit line to be discharged. This is then amplified by the global sense amplifier 50.

As described above, the operation of reading the data is carried out.

<Details of Read Operation>

Figure 10:
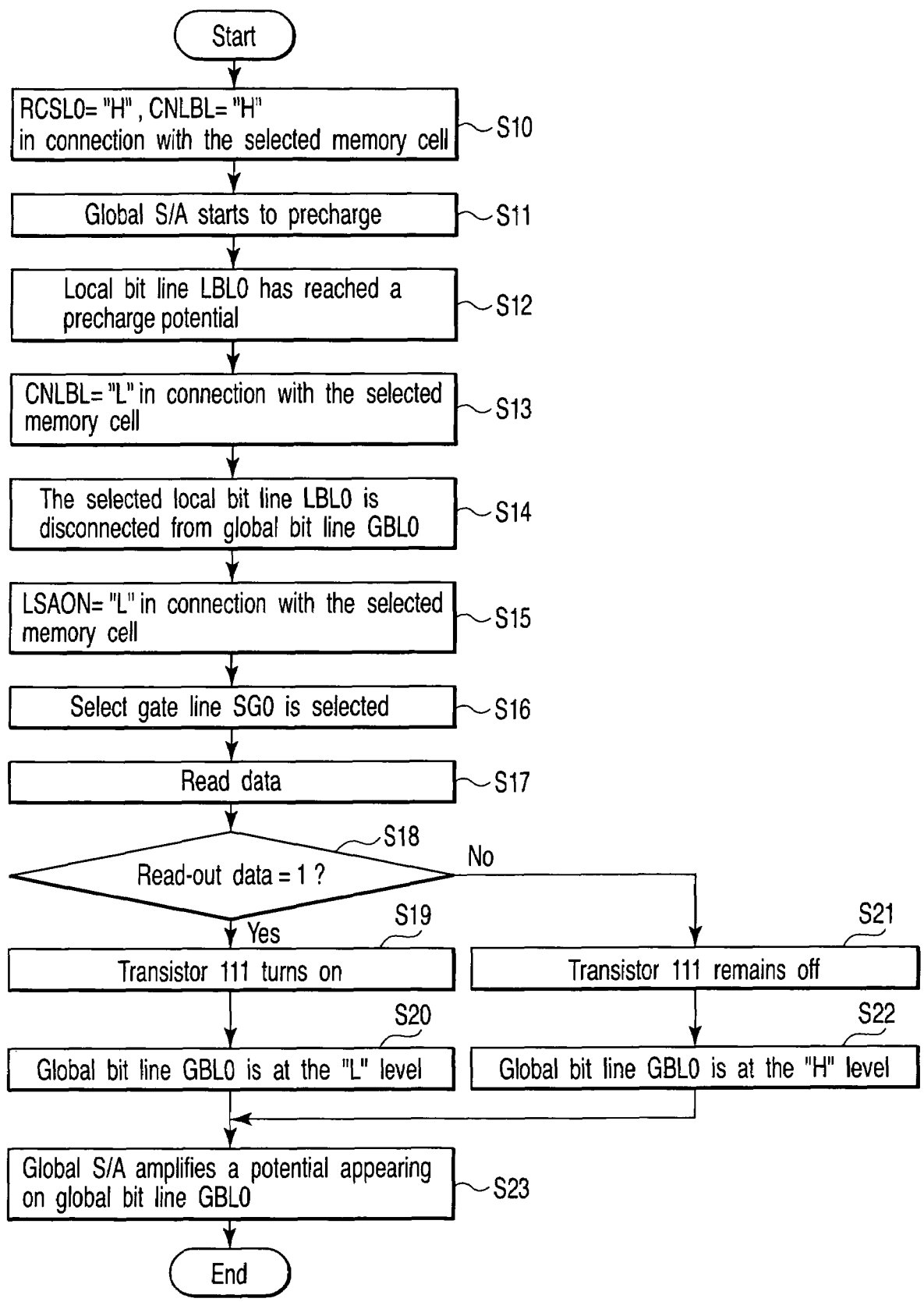
FIG. 10 is a flowchart to help explain a read operation in the 2Tr flash memory according to the first embodiment.
Figure 11:
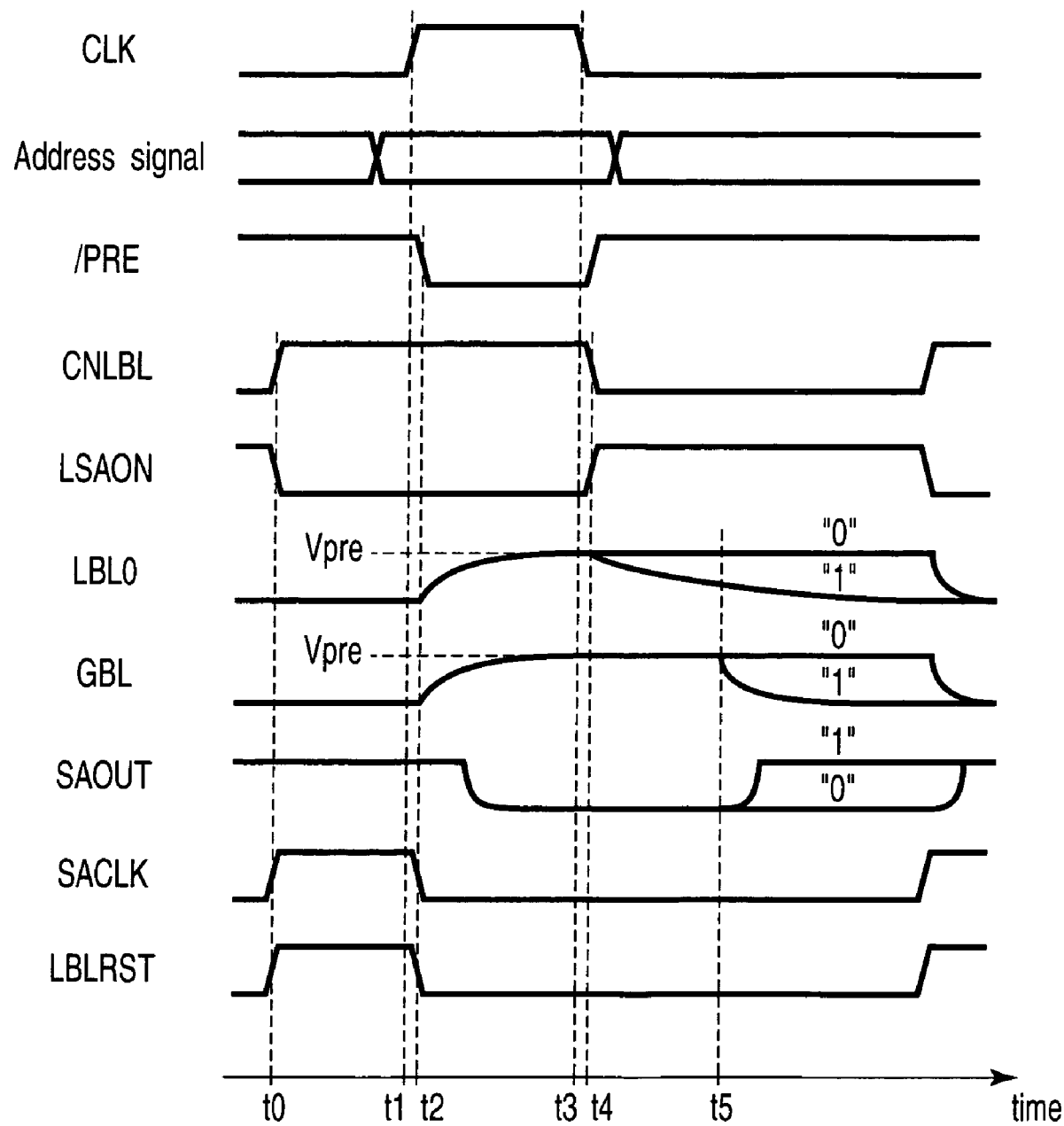
FIG. 11 is a timing chart for various signals in a read operation in the 2Tr flash memory according to the first embodiment.

Next, using FIGS. 5, 6, 10, and 11, a read operation will be explained in detail. FIG. 10 is a flowchart to help explain a read operation. FIG. 11 is a timing chart for various signals in a read operation.

Hereinafter, a case where the data is read from the memory cell MC connected to word line WL0, select gate line SG0, local bit line LBL0, and global bit line GBL0 will be explained as an example. Suppose the memory cell from which the data is to be read is referred to as the selected memory cell and the memory cell block 11 and memory cell group 14 which include the selected memory cell are referred to as the selected memory cell block 11 and selected memory cell group 14, respectively. Moreover, suppose the local bit line to which the selected memory cell is connected is referred to as the selected local bit line. In addition, the Y-selector 12 and local sense amplifier group 13 which are provided so as to correspond to the selected memory cell block 11 are referred to as the selected Y-selector 12 and selected local sense amplifier group 13, respectively.

First, the column decoder 30 puts the read column select line RCSL0 connected to the selected Y-selector 12 at the high ("H") level and the read column select lines RCSL1 to RCSL3 at the low ("L") level. In addition, the column decoder 30 brings all of the read column select lines RCSL0 to RCSL3 connected to the unselected Y-selectors 12 into the low ("L") level. As a result, in the selected Y-selector 12, the MOS transistor 16-0 goes into the on state and the MOS transistors 16-1 to 16-3 go into the off state. In the unselected Y-selectors 12, all of the MOS transistors 16-0 to 16-3 go into the off state. Furthermore, the column decoder 30 puts the connect signal line CNLBL connected to the selected local sense amplifier group 13 at the high ("H") level and the connect signal lines CNLBL connected to the unselected local sense amplifier groups 13 at the low ("L") level. Accordingly, in the local sense amplifier 17 included in the selected local sense amplifier group 13, the MOS transistor 110 is turned on. As a result, 16 local bit lines LBL0 connected to the respective memory cell groups 14 in the selected memory cell block 11 are electrically connected via the local sense amplifiers 17 to the global bit lines GBL0 to GBL15, respectively (step S10, time t0). Moreover, the column decoder 30 brings the sense signal line LSAON connected to the selected local sense amplifier group 13 into the low ("L") level. Therefore, the MOS transistor 112 in each local sense amplifier 17 included in the selected local sense amplifier group 13 is turned off.

Furthermore, at this point in time, the column decoder 30 brings the reset signal line LBLRST connected to at least the selected local sense amplifier group 13 into the high ("H") level. As a result, in each local sense amplifier 17 included in the selected local sense amplifier group 13, the MOS transistor 113 is turned on. Consequently, the selected local bit line LBL0 and global bit lines GBL0 to GBL15 are set at 0 V (or reset). In addition, in the above period, the column address signal CA and row address signal RA are supplied from the input/output buffer 70 to the column decoder 30 and row decoder 20.

Next, the global sense amplifier 50 precharges the global bit line GBL0 and selected local bit line LBL0 (step S11). That is, the column decoder 30 puts the column select line CSL0 at the high ("H") level and the column select lines CSL1 to CSL15 at the low ("L") level, thereby turning on the MOS transistor 41-0 and turning off the MOS transistors 41-1 to 41-15 in the column selector 40. As a result, the global sense amplifier 50 and the selected local bit line LBL0 are electrically connected to each other via global bit line GBL0. Moreover, in response to a clock signal CLK given by the clock generator circuit or CPU 2 included in the 2Tr flash memory 3 (time t1), a precharge signal /PRE is brought into the low ("L") level (time t2). The precharge signal /PRE is a signal which is asserted before precharging. Then, the global sense amplifier 50 precharges the global bit line GBL0 electrically connected to the global sense amplifier 50 and the selected local bit line LBL0. At this time, since the MOS transistors 41-1 to 41-15 are in the off state, the global bit lines GBL1 to GBL15 and unselected local bit lines are not precharged. Of course, while precharging is being done, the reset signal line LBLRST is kept at the low ("L") level.

Figure 12:
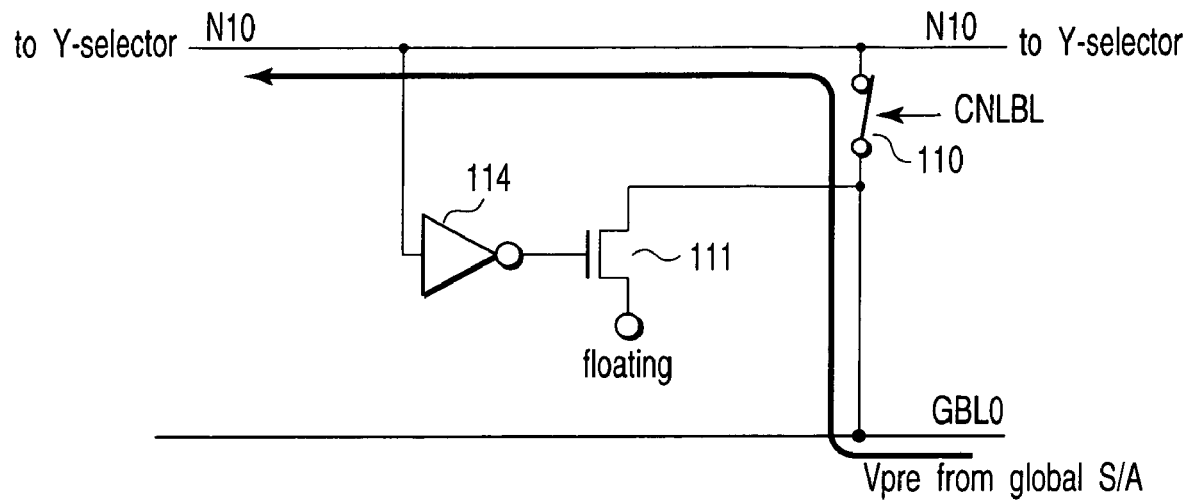
FIG. 12 is an equivalent circuit diagram of the local sense amplifier included in the 2Tr flash memory according to the first embodiment, showing a precharge operation.

FIG. 12 shows the state of the local sense amplifier 17 related to the selected local bit line LBL0 during precharging. As shown in FIG. 12, node N10 and global bit line GBL0 are connected to the MOS transistor 110. The source potential of the MOS transistor 111 is in the floating state. Since the inverted signal of the precharge potential is input to the gate of the MOS transistor 111, the MOS transistor 111 is in the off state.

After the global bit line GBL0 and selected local bit line LBL0 have reached a precharge potential Vpre (step S12), the precharge signal /PRE is negated (high ("H") level) in response to the clock signal CLK, which completes the precharging. Then, the connect signal line CNLBL connected to the selected local sense amplifier group 13 is put at the low ("L") level (step S12, time t4). Accordingly, in the local sense amplifier 17 included in the selected local sense amplifier 13, the MOS transistor 110 is turned off. As a result, the selected local bit line LBL0 and the global bit line GBL0 are disconnected electrically from each other (step S14). Then, the column decoder 30 brings the sense signal LSAON connected to the selected local sense amplifier group 13 into the high ("H") level (step S15). As a result, in the local sense amplifier 17 included in the selected local sense amplifier group 13, the MOS transistor 112 is turned on.

Then, on the basis of the row address signal RA, the row decoder 20 selects select gate line SG0 (step S16). That is, the voltage Vcc2 is applied to select gate line SG0. To word line WL0, 0 V is applied. The operation of selecting select gate line SG0 may be carried out before, for example, time t1.

As a result, the data starts to be read from the memory cell MC (step S17). If the data read onto the selected local bit line LBL0 is "1" (step S18), the potential on the selected local bit line LBL0 will drop from the precharge potential. Therefore, at a certain point in time (time t5 in FIG. 11), the output of the inverter 114 inverts to the high ("H") level. As a result, the MOS transistor 111 is turned on (step S19) and the potential on the global bit line GBL0 becomes 0 V (step S20).

In contrast, if the data read onto the selected local bit line LBL0 is "0" data (step S18), the potential on the selected local bit line LBL0 remains at the precharge potential. Therefore, the output of the inverter 114 remains at the low ("L") level and the MOS transistor 111 also remains off (step S21). Accordingly, the potential on the global bit line GBL0 is also kept at the precharge potential (step S22).

Figure 13:
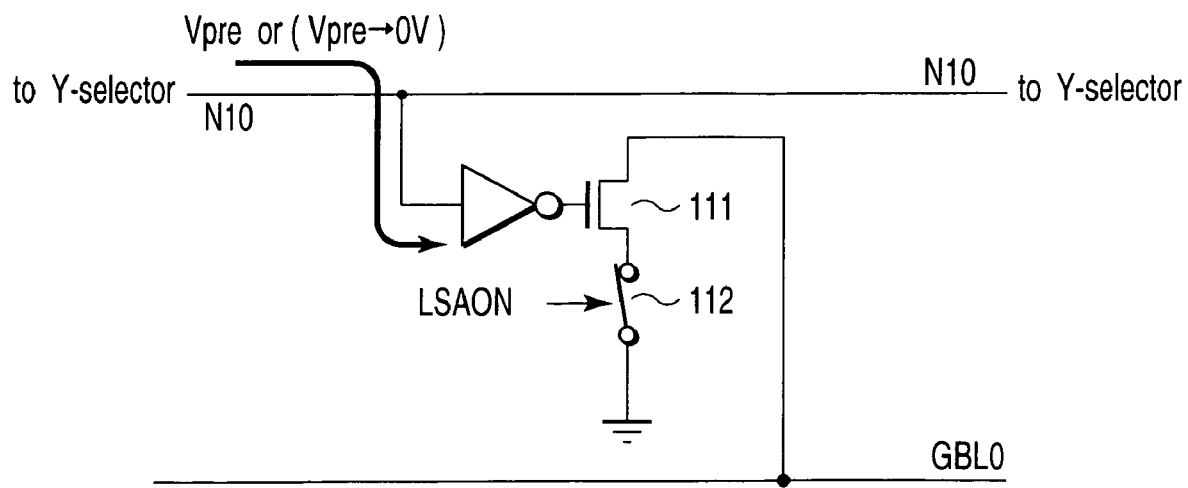
FIG. 13 is an equivalent circuit diagram of the local sense amplifier included in the 2Tr flash memory according to the first embodiment, showing a discharge operation.

FIG. 13 shows a state where the local sense amplifier 17 related to the selected local bit line operates in a read operation. As shown in FIG. 13, since the MOS transistor 112 is on, the source potential of the MOS transistor 111 is at 0 V. then, the gate of the MOS transistor 111 is controlled by the inverted signal of the potential at node N10. Accordingly, if the potential at node N10 is at the precharge potential, the global bit line GBL0 is connected to the ground potential via the current paths of the MOS transistors 111, 112.

Thereafter, the global sense amplifier 50 amplifies and inverts the data read onto the global bit line GBL0 and outputs the resulting data as an output signal SAOUT to the input/output buffer 70.

As described above, the flash memory according to the first embodiment produces the effect described in item (1).

(1) Power consumption in a read operation can be reduced.

Figure 14:
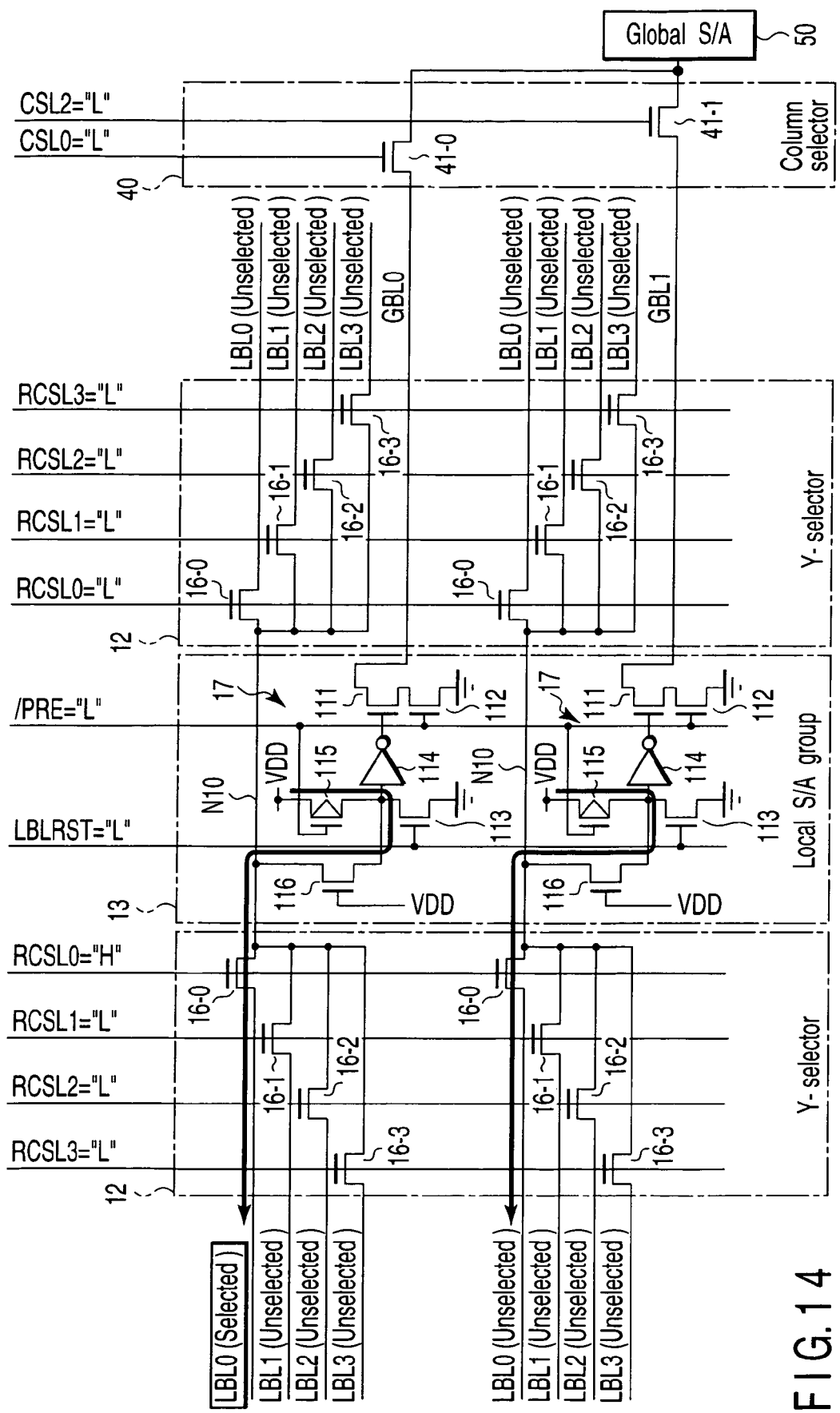
FIG. 14 is a circuit diagram of a Y-selector, a local sense amplifier group, a column selector, and a global sense amplifier included in a flash memory, showing a precharge operation.

With the flash memory according to the first embodiment, in a read operation, only the local bit line connected to the selected memory cell MC is precharged and the other unselected local bit lines are not precharged. Accordingly, the power consumption in precharging can be reduced. This will be explained in detail below in comparison with a case where the local sense amplifier 17 precharges the local bit lines. FIG. 14 is a circuit diagram of the Y-selector 12, local sense amplifier group 13, column selector 40, and global sense amplifier 50 in the flash memory in a case where the local sense amplifier 17 precharges the local bit lines. FIG. 14 particularly shows the configuration related to the global bit lines GBL0, GBL1.

In FIG. 14, each local sense amplifier 17 precharges a local bit line. To do precharging, the precharge circuit 17 is modified in the configuration of FIG. 6 of the first embodiment as follows.

MOS transistor 110 is eliminated.

Precharge signal /PRE is input to the gate of MOS transistor 112.

MOS transistor 115 is added whose gate is connected to /PRE, whose source is connected to a power supply voltage VDD, and whose drain is connected to the drain of the MOS transistor 113.

MOS transistor 116 is added whose gate is connected to VDD, whose drain is connected to node N10, and whose source is connected to the drain of the MOS transistor 113.

In the configuration of FIG. 14, the precharge signal /PRE is asserted, which starts precharging. At this time, the precharge signal /PRE is shared by a plurality of local sense amplifiers 17 included in one local sense amplifier group 13. Thus, when the precharge signal /PRE is asserted, all of the local sense amplifiers 17 included in the same local sense amplifier group 13 do precharging. For example, as shown in FIG. 14, when the data is read from the memory cell group 14 corresponding to the global bit line GBL0, not only the local bit line LBL0 corresponding to the global bit line GBL0 but also the local bit lines LBL0 corresponding to the other global bit lines GBL1 to GBL15 are also precharged. The local bit lines LBL0 corresponding to the global bit lines GBL1 to GBL15 are the local bit lines which need not be precharged. As described above, although only one local bit line requires precharging, 16 local bit lines are precharged. As a result, the power consumption in precharging is high. Since the power consumption is high, it is necessary to make power supply lines sufficiently thicker to prevent a drop in the power supply voltage, which causes the problem of increasing the area of the flash memory. Of course, it is conceivable that only the local bit line connected to the selected memory cell MC is precharged by decoding the precharge signal /PRE. In this case, however, an additional decode circuit is needed and therefore the area of the flash memory increases.

Figure 15:
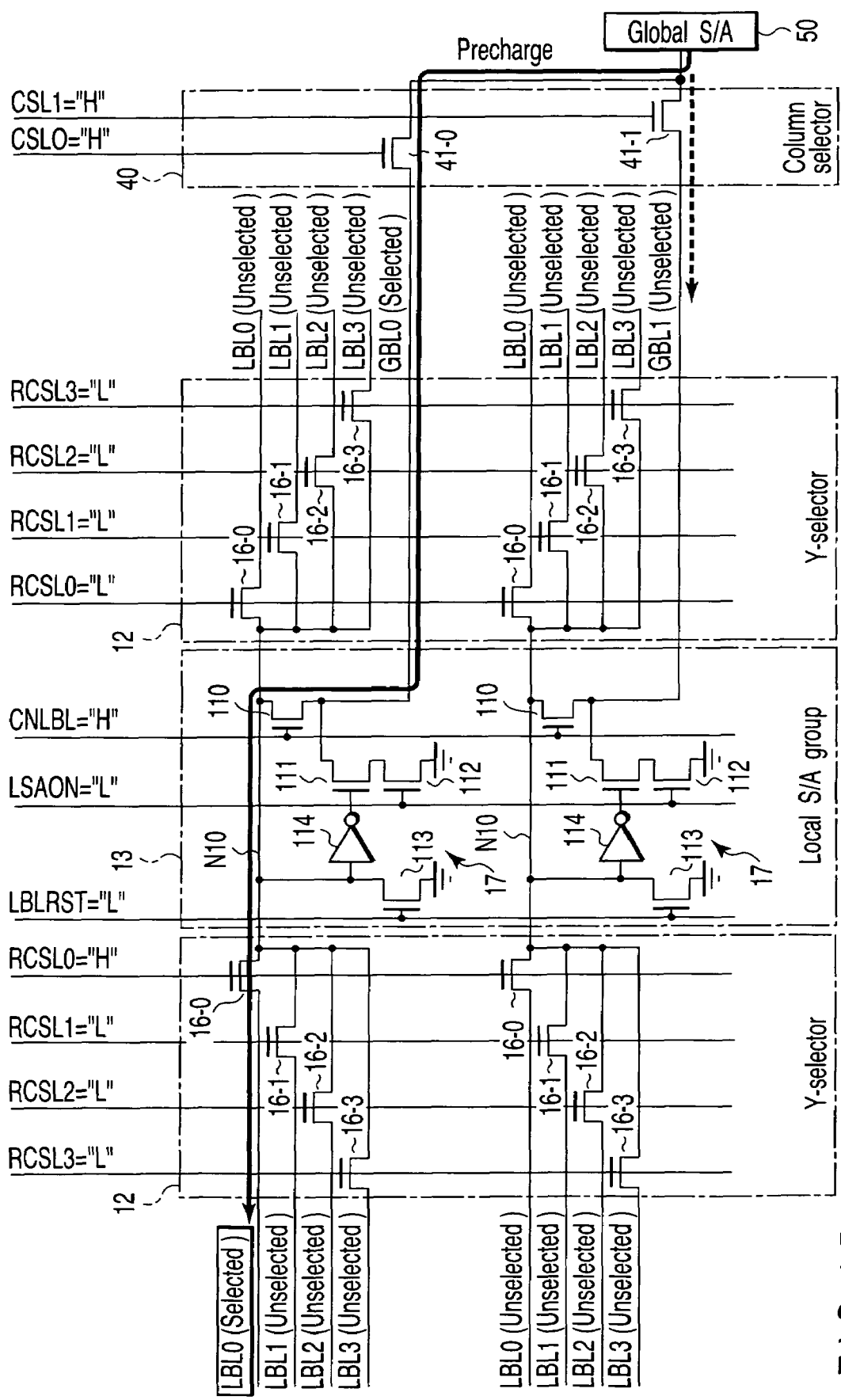
FIG. 15 is a circuit diagram of a Y-selector, a local sense amplifier group, a column selector, and a global sense amplifier included in the 2Tr flash memory according to the first embodiment, showing a precharge operation.

With the configuration of the first embodiment, however, the global sense amplifier 50 does precharging. FIG. 15 is a circuit diagram of the Y-selector 12, local sense amplifier group 13, column selector 40, and global sense amplifier 50 in the flash memory of the first embodiment. FIG. 15 particularly shows the configuration related to the global bit lines GBL0, GBL1. As shown in FIG. 15, the column selector 40 causes only the selected local sense amplifier group 13 to be connected to the global sense amplifier 50. Then, the Y-selector 12 causes only the local bit line LBL0 to be connected to the local sense amplifier 17. Specifically, the global sense amplifier 50 is electrically connected via the global bit line GBL0, sense amplifier 17, and MOS transistor 16-0 to the local bit line LBL0 connected to the selected memory cell and is not connected to the other local bit lines. Therefore, the unnecessary local bit lines are not precharged, which reduces the power consumption. The reduction in the power consumption enables the power supply lines to be made as thick as conventional equivalents. Moreover, since the decoding of the precharge signal is not needed, the above effect can be achieved without an increase in the area of the decode circuit.

Furthermore, the configuration of the local sense amplifier 17 can be simplified. In the local sense amplifier 17 of the first embodiment, the MOS transistor 115 in the configuration of FIG. 14 is not needed. The reason is that, in the first embodiment, the global sense amplifier 50 does precharging. In addition, since the voltage supplied from the global sense amplifier 50 is clamped, the MOS transistor 116 of FIG. 14 is also unnecessary.

(2) A read operation can be made faster (part 1)

In the reading method of the first embodiment, after the precharge operation is completed, the connect signal line CNLBL is brought into the low ("L") level, thereby electrically disconnecting the global bit line and the local bit lines from each other. Therefore, in the selected memory cell MC, the capacitance existing on the global bit line can be ignored. Accordingly, in the selected memory cell MC, only the charge on the local bit line has to be discharged (in the case of "1" data), which makes the read operation faster.

The potential on the global bit line is controlled by the inverter 114 and MOS transistors 111, 112. Specifically, when the output of the inverter 114 is at the high ("H") level, the MOS transistor 111 is turned on. Then, the MOS transistors 111, 112 cause the potential on the global bit line to approach 0 V. At this time, making the size of the MOS transistor 111 (or 112) (more specifically, for example, the gate width of the MOS transistor) larger than that of the transistor included in the memory cell enables the current driving capability of the MOS transistor 111 (or 112) to be made larger than the transistor in the memory cell. As a result, the potential on the global bit line is caused to approach 0 V at high speed, which makes the read operation faster.

Figure 16:
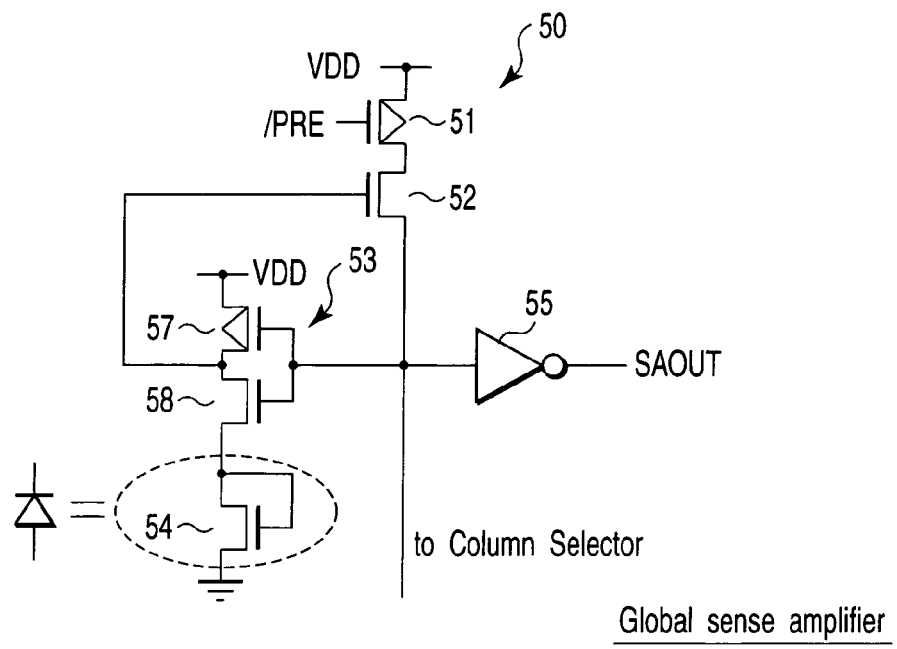
FIG. 16 is a circuit diagram of a global sense amplifier included in a 2Tr flash memory according to a second embodiment of the present invention.

Next, a semiconductor memory device according to a second embodiment of the present invention and its control method will be explained. The second embodiment relates to the configuration of the global sense amplifier 50 in the flash memory explained in the first embodiment. FIG. 16 is a circuit diagram of a global sense amplifier included in a flash memory according to the second embodiment. Since the configuration excluding the global sense amplifier 50 is the same as that of the first embodiment, its explanation will be omitted.

As shown in FIG. 16, the global sense amplifier 50 includes a p-channel MOS transistor 51, n-channel MOS transistors 52, 54, and inverters 53, 55. A precharge signal /PRE is input to the gate of the MOS transistor 51. The MOS transistor 51 has its source connected to the power supply voltage VDD and its drain connected to the drain of the MOS transistor 52. The MOS transistor 52 has its gate connected to the output node of the inverter 53 and its drain connected to the input nodes of the inverters 53, 55. The MOS transistor 54 has its gate and drain connected to the low-voltage-side power supply voltage node of the inverter 53 and its source connected to the ground potential. Then, the output of the inverter 55 becomes the output SAOUT of the global sense amplifier 50. The input nodes of the inverters 53, 55 are connected to the column selector 40.

The inverter 53 includes a p-channel MOS transistor 57 and an n-channel MOS transistor 58. The gates of the MOS transistors 57, 58 are connected in common. This common junction node functions as the input node of the inverter 53. The drains of the MOS transistors 57, 58 are connected in common. This common junction node functions as the output node of the inverter 53. The source of the MOS transistor 57, which is the high-voltage-side power supply voltage node, is connected to, for example, the power supply voltage VDD. The drain of the MOS transistor 58, which is the low-voltage-side power supply voltage node of the inverter 53, is connected to the gate and drain of the MOS transistor 54. Therefore, the function of the MOS transistor 54 is equivalent to that of a diode. It can be said that the low-voltage-side power supply voltage node of the inverter 53 is grounded via a diode.

When the precharge signal /PRE is brought into the low ("L") level in a precharge operation, the global sense amplifier 50 with the above configuration precharges the global bit line and the local bit lines. Then, the potential on the global bit line rises from 0 V and the potential at the input node of the inverter 53 eventually exceeds the threshold voltage of the inverter 53. As a result, the output of the inverter 53 inverts from the high ("H") level to the low ("L") level. Consequently, the MOS transistor 52 is turned off, which completes the precharging.

The configuration of the global sense amplifier of the second embodiment produces not only the effects in item (1) and item (2) explained in the first embodiment but also the effect in item (3) explained below.

(3) A read operation can be made faster (part 2)

In the configuration of the second embodiment, a diode is provided between the low-voltage-side power supply voltage node of the inverter 53 and the low-voltage-side power supply voltage. The presence of the diode causes the inverted threshold value of the inverter 53, that is, the precharge completion decision threshold value to rise, which enables the read operation to be made faster. This will be explained below.

When precharging is done with the global sense amplifier 50, a precharge voltage (VDD) is applied to the local bit line via the MOS transistor 52 in the global sense amplifier 50, any one of the MOS transistors 41-0 to 41-15 in the column selector 40, the MOS transistor 110 in the local sense amplifier 17, and any one of the MOS transistors 16-0 to 16-3 in the Y-selector 12. Therefore, in this case, the precharging capability deteriorates as compared with a case where precharging is done with the local sense amplifier 17. Since there is a propagation delay in the control signal of the connect signal line CNLBL and the decode signal of the Y-selector 12, the potential on the global bit line becomes higher than the threshold voltage of the inverter before the local bit line is sufficiently precharged to the precharge potential. Then, the output of the inverter 53 functions so as to suppress the precharging (that is, the output of the inverter 53 becomes lower than VDD). Accordingly, when the charge moves from the global bit line to the local bit line as a result of the Y-selector 12 selecting any one of the local bit lines, the output of the inverter 53 becomes lower than VDD. Therefore, the precharging capability of the global sense amplifier 50 at this time is low and therefore it takes time to precharge the local bit line.

With the configuration of the second embodiment, however, the inverted threshold value of the inverter 53 is higher by the threshold value of the MOS transistor 54 connected so as to function as a diode. Therefore, it is possible to suppress the output of the inverter 53 dropping below VDD until the local bit line is sufficiently precharged. That is, the deterioration of the precharging capability of the global sense amplifier 50 can be suppressed, which enables the precharging time to be shortened. As a result, the read operation can be made faster.

Figure 17:
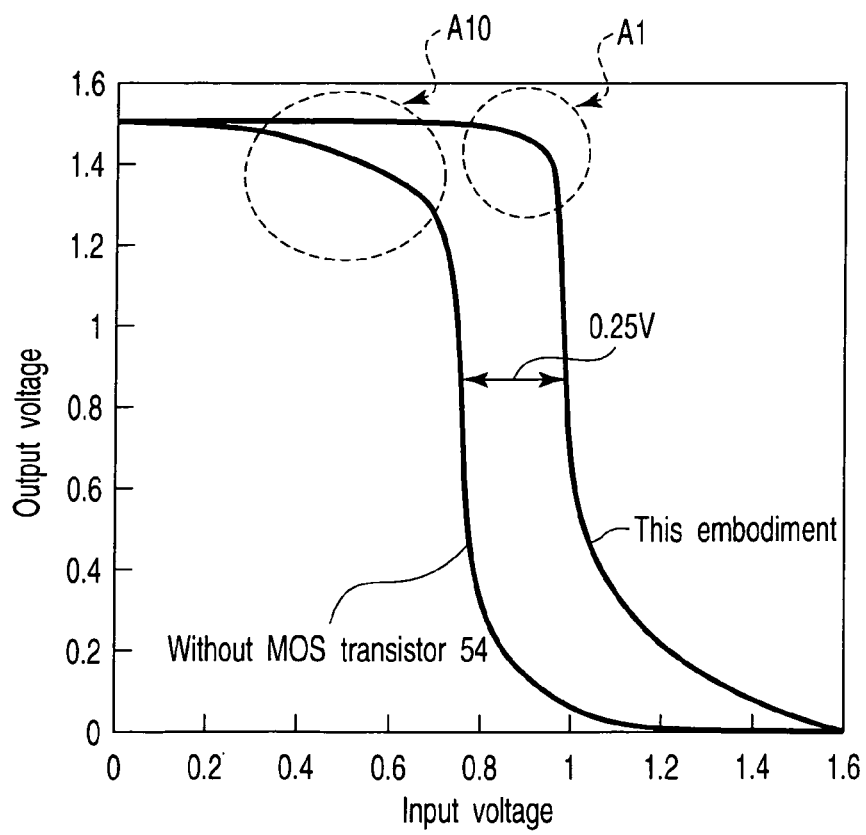
FIG. 17 is a graph showing an input/output characteristic of an inverter included in the global sense amplifier included in the 2Tr flash memory according to the second embodiment.

FIG. 17 shows an example of the input/output characteristic of the inverter 53. Input voltages and output voltages are plotted on the abscissa axis and ordinate axis, respectively. For the purpose of reference, FIG. 17 also shows an input/output characteristic in a case where the MOS transistor 54 is not provided, for reference. As shown in FIG. 17, in the input/output characteristic of the inverter 53 of the second embodiment, the output inverted threshold value rises (0.25 V in FIG. 17) as compared with a case where the MOS transistor 54 is not provided. Moreover, use of a diode makes it possible to effectively suppress a leakage current in the inverter 53 (of the MOS transistor 53 in particular). Therefore, as shown in region A1 of FIG. 17, the input/output characteristic has drawn a sharper rectangular curve than that of a conventional one (region A10). That is, the output voltage drops less easily even if the input voltage rises than in the prior art, which improves the precharging capability of the global sense amplifier 50.

While in the second embodiment, a diode is used as means for raising the threshold voltage of the inverter 53, another element that produces the same effect, for example, a resistive element, may be used. Changing the ratio of the gate widths of the MOS transistors 57, 58 can be considered as another method of changing the threshold voltage of the inverter. In this method, however, it is difficult to change the threshold voltage greatly. Therefore, it is desirable to use a diode.

Figure 18:
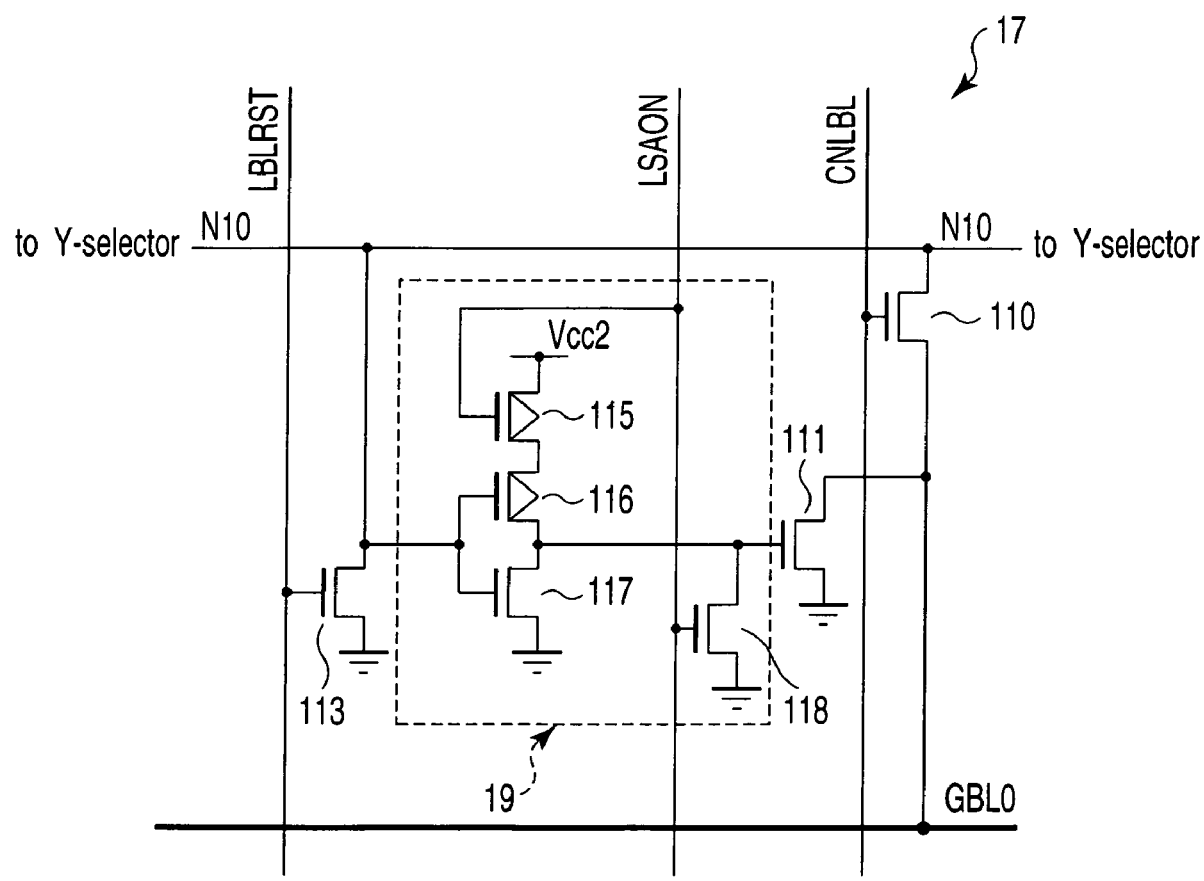
FIG. 18 is a circuit diagram of a local sense amplifier included in a 2Tr flash memory according to a third embodiment of the present invention.

Next, a semiconductor memory device according to a third embodiment of the present invention and a method of controlling the semiconductor memory device will be explained. The third embodiment is such that the configuration of the local sense amplifier 17 in each of the first and second embodiments is improved. FIG. 18 is a circuit diagram of a local sense amplifier 17 according to the third embodiment. Since the configuration excluding the global sense amplifier 50 is the same as that of the first embodiment, its explanation will be omitted.

The configuration of the local sense amplifier 17 of the third embodiment is such that the inverter 114 is replaced with a NOR-type circuit in the configuration of FIG. 6 explained in the first embodiment. As shown in FIG. 18, the inverter 17 includes n-channel MOS transistors 110, 111, 113 and a NOR gate 119. A connect signal line CNLBL is connected to the gate of the MOS transistor 110. The MOS transistor 110 has its drain connected to node N10 and its source connected to the corresponding global bit line. The MOS transistor 111 has its gate connected to the output node of the NOR gate 119, its drain connected to the corresponding global bit line, and its source connected to the ground. The MOS transistor 113 has its gate connected to a reset signal line LBLRST, its drain connected to node N10 and the input node of the NOR gate 119, and its source connected to the ground.

The NOR gate 119 includes p-channel MOS transistors 115, 116 and n-channel MOS transistors 117, 118. The MOS transistor 115 has its gate connected to a sense signal line LSAON, its source connected to a power supply potential (e.g., Vcc2), and its drain connected to the source of the MOS transistor 116. The gates of the MOS transistors 116, 117 function as the input node of the NOR gate 119 and their drains function as the output node of the NOR gate 119. The source of the MOS transistor 117 is connected to the ground. The MOS transistor 118 has its gate connected to the sense signal line LSAON and its source connected to the ground. The drain of the MOS transistor 118 functions as the output node of the NOR gate 119.

With the above configuration, in a precharge operation, the connect signal line CNLBL and sense signal line LSAON are brought into the high ("H") level. As a result, the MOS transistors 110, 118 are turned on and the MOS transistors 111, 115 are turned off. In reading data, the connect signal line CNLBL and sense signal line LSAON are brought into the low ("L") level. As a result, the MOS transistors 110, 118 are turned off and the MOS transistor 115 is turned on. Then, if the read data is "1" data, the MOS transistor 116 is turned on and therefore the output of the NOR gate 119 goes to the high ("H") level. As a result, the MOS transistor 111 is turned on, which discharges the potential on the global bit line. On the other hand, if the read data is "0" data, the MOS transistor 117 is turned on and therefore the output of the NOR gate 119 goes to the low ("L") level. Consequently, the MOS transistor 111 is turned off, with result that the potential of the global bit line remains at the precharge potential.

The configuration according to the third embodiment produces not only the effects explained in item (1) to item (3) explained in the first and second embodiments but also the effect in item (4) explained below.

(4) The operation reliability of the local sense amplifier can be improved.

In the configuration of the third embodiment, the inverter 114 in the local sense amplifier 17 explained in the first embodiment is replaced with the NOR gate 119. When an inverter is used, a through current might flow from the power supply voltage node toward the ground potential node, depending on circumstances. However, use of the NOR gate 119 prevents a through current from flowing, which improves the operation reliability of the local sense amplifier 17.

Figure 19:
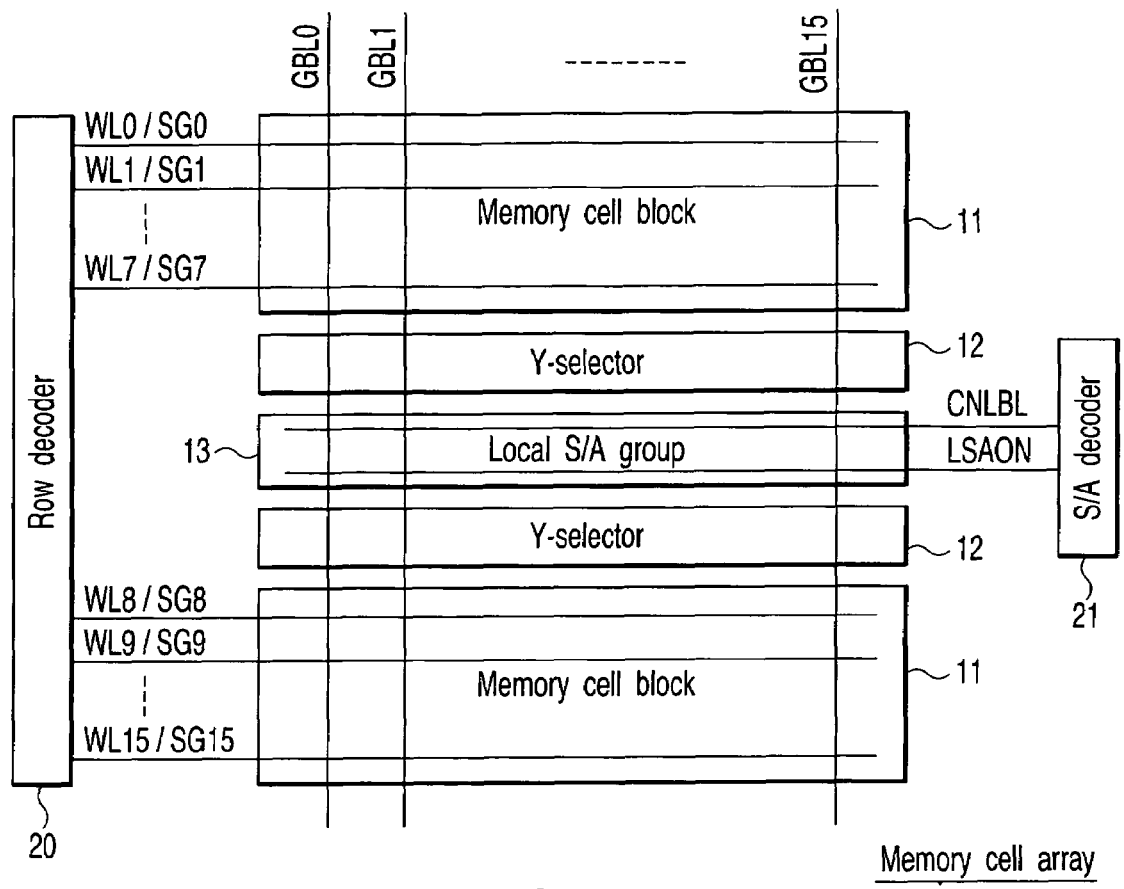
FIG. 19 is a block diagram of a part of a 2Tr flash memory according to a fourth embodiment of the present invention.

Next, a semiconductor memory device according to a fourth embodiment of the present invention will be explained. The fourth embodiment relates to a method of arranging a decode circuit in the third embodiment. FIG. 19 is a block diagram of a part of the flash memory 3 according to the fourth embodiment.

The flash memory 3 of the fourth embodiment is such that a sense amplifier decoder 21 is added to the configuration explained in the first embodiment. The sense amplifier decoder 21 carries out the operation of selecting the connect signal line CNLBL and sense signal line LSAON in the function of the row decoder 20 explained in the first embodiment. As shown in FIG. 19, the sense amplifier decoder 21 is provided so as to face the row decoder 20, with the memory cell array 10 being sandwiched between them. In other words, the row decoder 20 is provided so as to select the memory cell connected to global bit line GBL0 faster than the one connected to global bit line GBL15. On the other hand, the sense amplisier decoder 21 is provided so as to select the local sense amplifier 17 connected to global bit line GBL15 faster than the one connected to global bit line GBL0.

The semiconductor memory device of the fourth embodiment produces not only the effects in item (1) to item (4) explained in the first to third embodiment but also the effect in item (5) explained below.

(5) A read operation can be made faster (part 3).

Figure 20:
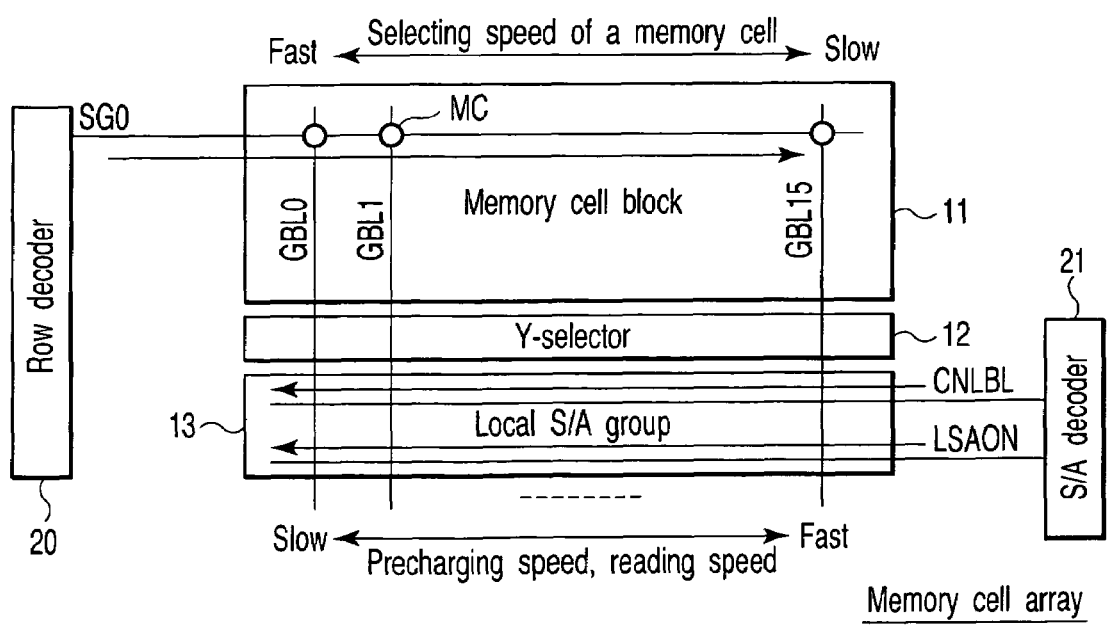
FIG. 20 is a block diagram of a part of the 2Tr flash memory according to the fourth embodiment.

This effect will be explained using FIG. 20. FIG. 20 is a block diagram of the memory cell block 11, Y-selector 12, local sense amplifier group 13, row decoder 20, and sense amplifier decoder 21. In the configuration of the fourth embodiment, the functional block (row decoder 20) which selects a select gate line is separated from the functional block (sense amplifier decoder 21) which selects the connect signal line CNLBL and sense signal line LSAON. These functional blocks are arranged so as to face each other in a direction along the word line, with the memory cell array 10 being sandwiched between them.

Then, as shown in FIG. 20, the global bit line closest to the row decoder 20 is global bit line GBL0 and the global bit line farthest from the row decoder 20 is global bit line GBL15. Accordingly, when a memory cell MC is selected, the memory cell MC connected to global bit line GBL0 is selected earliest and the memory cell MC connected to global bit line GBL15 is selected latest. Therefore, the memory cell MC connected to global bit line GBL0 starts to discharge the local bit line earliest and the memory cell MC connected to global bit line GBL15 starts to discharge the local bit line latest.

Furthermore, the global bit line closest to the sense amplifier decoder 21 is global bit line GBL15 and the global bit line farthest from the sense amplifier decoder 21 is global bit line GBL0. Accordingly, when the global bit line is disconnected from the local bit line, global bit line GBL15 is disconnected earliest and global bit lien GBL0 is disconnected latest. Similarly, as for the MOS transistors 112 in the local sense amplifier 17, the MOS transistor 112 corresponding to global bit line GBL15 is turned on earliest and the MOS transistor 112 corresponding to global bit line GBL0 is turned on latest. That is, global bit line GBL15 is earlier than global bit line GBL0 in terms of the completion of precharging of the local bit line and the timing of the local sense amplifier 17 going into a data reading state.

Therefore, a propagation delay in the select signal of the select gate line is offset by a propagation delay in the select signal of the connect signal line CNLBL and sense signal line LSAON, which suppresses a decrease in the operation speed due to a propagation delay in the signal.

Figure 21:
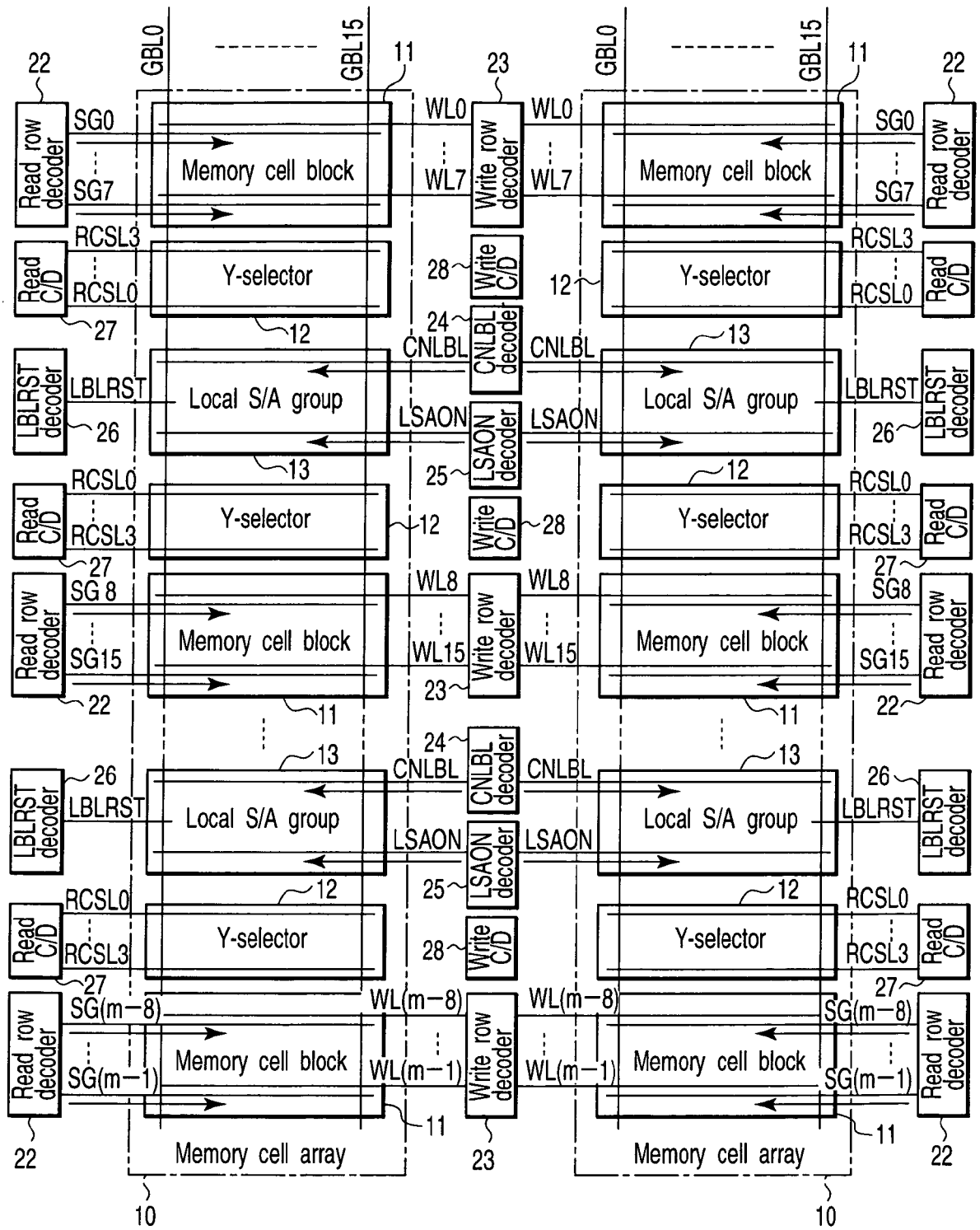
FIG. 21 is a block diagram of a part of a 2Tr flash memory according to a fifth embodiment of the present invention.

Next, a semiconductor memory device according to a fifth embodiment of the present invention will be explained. The fifth embodiment is such that the row decoder 20 and column decoder 30 are divided into a read route and a write route in each of the first to third embodiments and then the fourth embodiment is applied. FIG. 21 is a block diagram of a flash memory 3 according to the fifth embodiment.

As shown in FIG. 21, in the configuration of the fifth embodiment, a read row decoder 22 and a write row decoder 23 are provided as the row decoder 20 explained in the first embodiment. In addition, a connect signal line decoder 24, a sense signal line decoder 25, a reset signal line decoder 26, a read column decoder 27, and a write column decoder 28 are provided as the column decoder 30. The remaining configuration is the same as that of FIG. 1.

On the basis of a row address signal RA, the write row decoder 23 selects word lines WL0 to WL(m-1) in a write operation and an erase operation and applies a positive voltage VPP or a negative voltage VBB to the selected word line. The write row decoder 23 further applies a voltage to a p-well region 92 in which the memory cell array 10 has been formed. On the basis of the row address signal RA, the read row decoder 24 selects select gate lines SG0 to SG(m-1) in a read operation and applies a positive voltage Vcc2 to the selected select gate line. The connect signal line decoder 24, sense signal line decoder 25, and reset signal line decoder 26 control the connect signal line CNLBL, sense signal line LSAON, and reset signal line LBLRST, respectively. On the basis of a column address signal CA, the read column decoder 27 selects any one of the read column select lines RCSL in a read operation. On the basis of the column address signal CA, the write column decoder 28 controls the Y-selector 12 in a write operation. The select operation of the write column decoder 28 will be explained later.

In the above configuration, the read row decoder 22 is arranged so as to face the write row decoder 23 in a direction along the word line, with the memory cell block 11 being sandwiched between them. The connect signal decoder 24 and sense signal line decoder 25 are arranged close to the write row decoder 23. That is, The connect signal decoder 24 and sense signal line decoder 25 are arranged so as to face the read row decoder 22 in a direction along the word line, with the memory cell array 10 being sandwiched between them. In the example of FIG. 21, the flash memory 3 has two memory cell arrays 10. The write row decoder 23, write column decoder 28, connect signal line decoder 24, and sense signal line decoder 25 are arranged between the two memory cell arrays 10 and switches between the two memory cell arrays 10.

Figure 22:
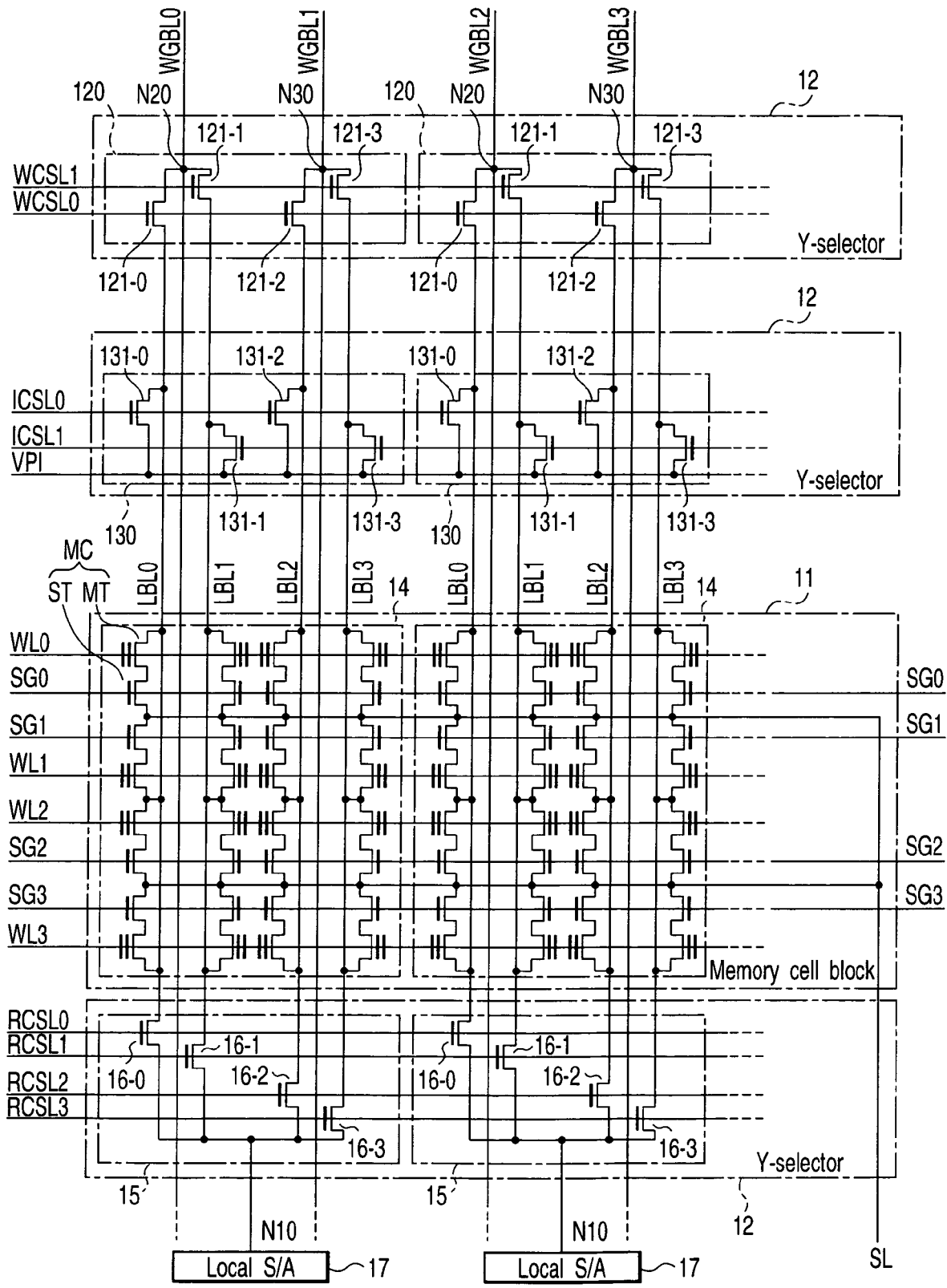
FIG. 22 is a circuit diagram of a memory cell array included in the 2Tr flash memory according to the fifth embodiment.

Next, the configuration of the Y-selector 12 included in the flash memory of the fifth embodiment will be explained using FIG. 22. FIG. 22 is a circuit diagram of the memory cell block 11 and Y-selector 12. The configuration of the memory cell block 11 is the same as that of the first embodiment. Although in FIG. 22, the number of memory cells MC connected to one local bit line is 4, this is illustrative and not restrictive.

As shown in FIG. 22, the Y-selector 12 includes not only the read select circuit 12 explained in the first embodiment but also a write select circuit 120 and a write inhibit select circuit 130. The write select circuit 120 and write inhibit select circuit 130 are provided for each memory cell group 14 as is the read select circuit 12.

Each of the write select circuits 120 includes four MOS transistors 121-0 to 121-3. One end of the current path of each of the MOS transistors 121-0 to 121-3 is connected to one end of the corresponding one of the local bit lines LBL0 to LBL3, respectively. The other ends of the current paths of the MOS transistors 121-0 and 121-1 are connected to each other at a common junction node and the other ends of the current paths of the MOS transistors 121-2 and 121-3 are connected to each other at a common junction node. Hereinafter, the common junction node of the MOS transistors 121-0 and 121-1 is called node N20 and the common junction node of the MOS transistors 121-2 and 121-3 is called node N30. The gates of the MOS transistors 121-0 to 121-3 are connected to either write column select line WCSL0 or WCSL1. The MOS transistors 121-0, 121-2 included in the write select circuit 120 in the same row are connected to the same write column select line WCSL0 and the MOS transistors 121-1, 121-3 included in the write select circuit 120 in the same row are connected to the same write column select line WCSL1. The write column select lines WCSL0, WSCL1 are selected by the write column decoder 28 in a write operation.

Each of node N20 and node N30 in the write select circuit 120 is connected to any one of the write global bit lines WGBL0 to WGBL31. Each of the write global bit lines WGBL0 to WGBL31 connects nodes N20 or nodes N30 in the write select circuits 102 in the same column to one another. In a write operation, the write data is supplied to the write global bit lines WGBL0 to WGBL31.

Next, the configuration of the write inhibit select circuit 130 will be explained. Each of the write inhibit select circuits 130 includes four MOS transistors 131-0 to 131-3. One end of the current path of each of the MOS transistors 131-0 to 131-3 is connected to the corresponding one of the local bit lines LBL0 to LBL3, respectively. Then, a write inhibit voltage VPI is applied commonly to the other ends of the current paths of the MOS transistors 131-0 to 131-3. The gates of the MOS transistors 131-0 to 131-3 are connected to either write inhibit column select line ICSL0 or ICSL1. The gates of the MOS transistors 131-0, 131-2 included in the write inhibit select circuit 130 in the same row are connected to the same write column select line ICSL0 and the gates of the MOS transistors 131-1, 131-3 included in the write inhibit select circuit 130 in the same row are connected to the same write column select line ICSL1. Write inhibit column select lines ICSL0, ICSL1 are selected by the write column decoder 28 in a write operation.

The global bit lines GBL0 to GBL15 explained in the first embodiment function as read global bit lines RGBL which are used in a read operation and not used in a write operation.

Figure 23:
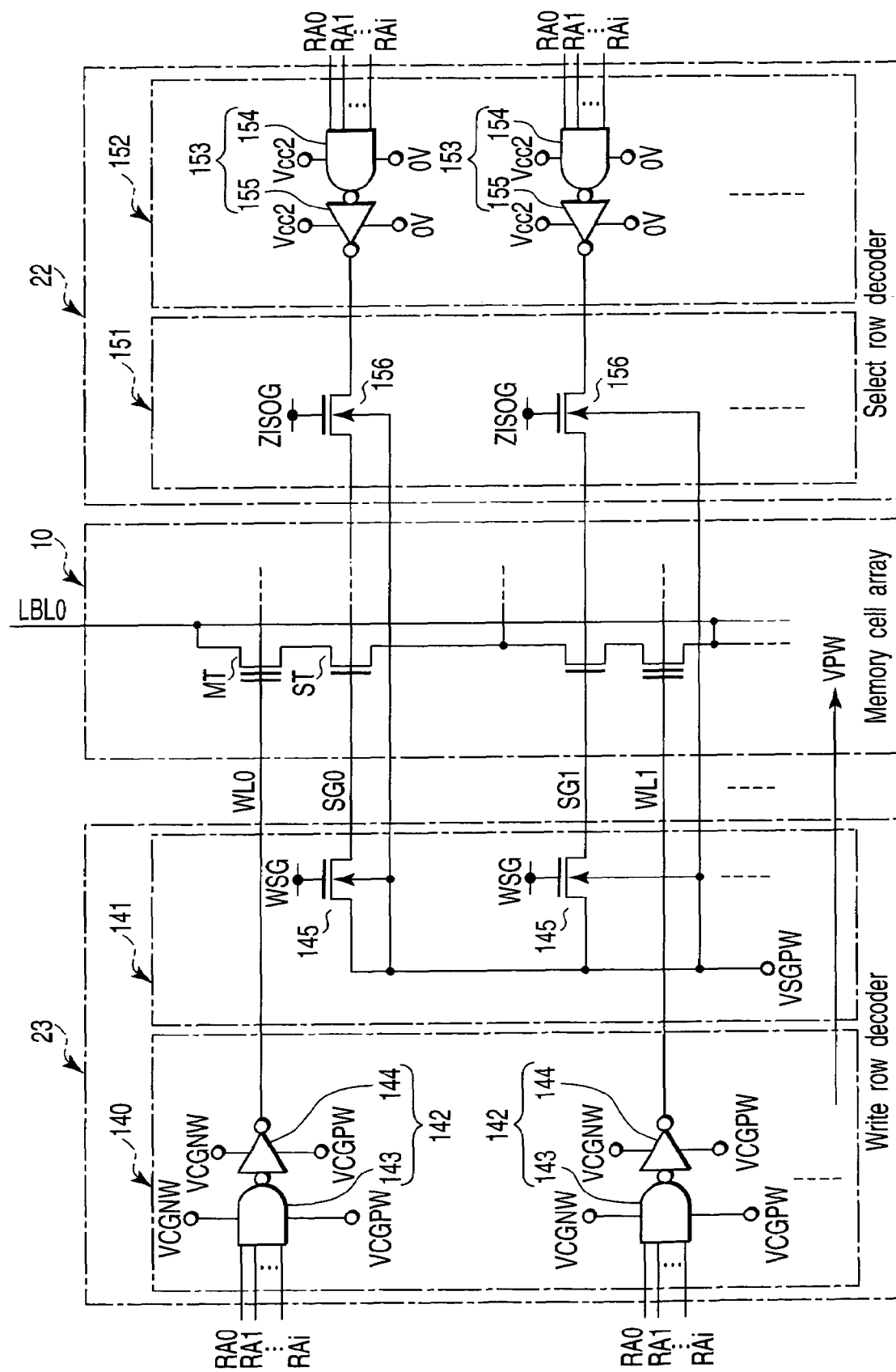
FIG. 23 is a circuit diagram of a memory cell array, a read row decoder, and a write row decoder included in the 2Tr flash memory according to the fifth embodiment.

Next, the configuration of the read row decoder 22 and write row decoder 23 will be explained using FIG. 23. FIG. 23 is a circuit diagram of the read row decoder 22, write row decoder 23, and memory cell array 10. In a write operation, the write row decoder 23 applies a negative voltage VBB to the p-well region 92 in which the memory cell array has been formed and to all of the select gate lines SG0 to SG(m-1). In an erase operation, the write row decoder 23 applies not only the negative voltage VBB to all of the word lines but also a positive voltage VPP to the p-well region 92. The read row decoder 22 selects any one of the select gate lines SG0 to SG(m-1) in a read operation and applies a positive potential Vcc2 to the selected select gate line.

The configuration of the read row decoder 22 and write row decoder 23 will be explained. First, the configuration of the read row decoder 22 will be explained. The read row decoder 22 includes an address decode section 152 and a switch element group 151. The address decode section 152, which is provided for each select gate line SG, operates on the power supply voltage Vcc2. The address decode section 152 includes a row address decode circuit 153 which decodes (i+1)-bit row address signals RA0 to RAi, thereby producing a row address decode signal. The row address decode circuit 153 includes a NAND gate 154 and an inverter 155. The NAND gate 154 performs NAND operation on each bit in the row address signals RA0 to RAi. Then, the inverter 155 inverts the result of the NAND operation and outputs the result as a row address decode signal.

The switch element group 151 has an n-channel MOS transistor 156. The MOS transistors 156 are provided for the select gate lines SG0 to SG(m-1) in a one-to-one correspondence. Then, the output of the inverter 155 is supplied via the current path of the MOS transistor 156 to the select gate lines SG0 to SG(m-1). A control signal ZISOG is input to the gate of the MOS transistor 156. Then, the control signal ZISOG turns off the MOS transistor 156 in a write operation and an erase operation and turns on the MOS transistor 156 in a read operation.

Next, the configuration of the write row decoder 23 will be explained. The write row decoder 23 includes an address decode section 140 and a switch element group 141. The address decode section 140, which is provided for each of the word lines WL0 to WL(m-1), includes a row address decode circuit 142 which decodes (i+1)-bit row address signals RA0 to RAi, thereby producing a row address decode signal. The row address decode circuit 142 includes a NAND gate 143 and an inverter 144. The NAND gate 143 performs NAND operation on each bit in the row address signals RA0 to RAi. Then, the inverter 144 inverts the result of the NAND operation and outputs the result as a row address decode signal. The power supply voltages of the NAND gate 143 and inverter 144 are supplied from VCGNW node and VCGPW node. To VCGNW node, 0 V or the positive voltage VPP is applied. To VCGPW node, 0 V or the negative voltage VBB is applied.

The switch element group 141 has an n-channel MOS transistor 145. The MOS transistors 145 are provided for the select gate lines SG0 to SG(m-1) in a one-to-one correspondence. The select gate liens SG0 to SG(m-1) are connected via the current path of the MOS transistor 145 to VSGPW node. To VSGPW, the negative voltage VBB is applied.

Next, the operation of the 2Tr flash memory configured as described above will be explained. Only what differs from the first embodiment will be explained below.

<Write Operation>

Data is written simultaneously into a plurality of memory cells MC connected to the same word line. Here, in the same memory cell block BLK, the memory cells into which data is written simultaneously are the following two: the memory cell connected to either local bit line LBL0 or LBL1 and the memory cell connected to either local bit line LBL2 or LBL3. Hereinafter, in FIG. 22, focusing on the memory cell groups connected to the write global bit lines WGBL0, WGBL1, explanation will be given using a case where data is written into the memory cell transistors MT connected to word line WL0 and local bit lines LBL0, LBL2.

First, 0 V is supplied as a write inhibit voltage VPI. Then, the write row decoder 23 selects word line WL0 and the positive voltage VPP is applied to the selected word line WL0. In addition, the negative voltage VBB is applied to VSGPW node. Then, in the write row decoder 23, the MOS transistor 145 is turned on, which causes the negative potential VBB to be applied from VSGPW node to all of the select gate lines SG0 to SG(m-1). Moreover, the write row decoder 23 applies the negative potential VBB to the p-well region 92. In the write operation, the signal ZISOG is set at the low ("L") level and the row address decode circuit 152 of the read row decoder 22 is separated electrically from the select gate line.

Of the two write column select lines connected to the write select circuit 120 corresponding to the memory cell block 11 including the selected word line WL0, the write column select line WCSL0 is selected by the write column decoder 28. This turns on the MOS transistors 121-0, 121-2 in the write select circuit 120. As a result, write global bit line WGBL0 and local bit line LBL0 are connected electrically to each other and write global bit line WGBL1 and local bit line LBL2 are connected electrically to each other.

Moreover, all of the write column select lines connected to the write select circuit 120 corresponding to the memory cell block 11 not including the selected word line WL0 are made unselected. Therefore, the MOS transistors 121-0 to 121-3 in the write select circuit 120 corresponding to the memory cell block 11 not including the selected word line WL0 are turned off.

Furthermore, the read column decoder 27 makes unselected all of the read column select lines RCSL0 to RCSL (4m-1), which turns off the MOS transistors 310 to 313 in all of the read column selectors RCS. Consequently, the read global bit line RGBL is separated electrically from the local bit lines LBL0 to LBL3.

In addition, to turn on the MOS transistors 131-1, 131-3 connected to the local bit lines LBL1, LBL3 to be made unselected, the write column decoder 28 brings the write inhibit column select line ICSL1 into the high ("H") level (Vcc2). The write column decoder 28 brings the write inhibit column select line ICSL0 connected to the MOS transistors 131-0, 131-2 corresponding to the selected local bit lines LBL0, LBL2 into the low ("L") level, which turns off the MOS transistors 131-0, 131-2. As a result, a write inhibit voltage of VPI=0 V is applied to the unselected local bit lines LBL1, LBL3.

Consequently, the write data (VBB or 0 V) is supplied from the write global bit line WGBL0 to the local bit line LBL0 via the MOS transistor 121-0 in the write select circuit 120. In addition, the write data (VBB or 0 V) is supplied from the write global bit line WGBL1 via the MOS transistor 121-2.

<Read Operation>

Next, a read operation will be explained. In a read operation, the write column decoder 28 makes all of the write column select lines WCSL0, WCSL1 unselected and further all of the write inhibit column select liens ICSL0, ICSL1 unselected. As a result, the local bit lines LBL0 to LBL3 are disconnected from the write global bit line and the write inhibit voltage VPI.

Then, after the potential on the read global bit line has reached a specific precharge potential, the signal ZISOG is put at the high ("H") level and the MOS transistor 156 of the read row decoder 22 is turned on. Then, the read row decoder 22 selects the select gate line SG0 ("H" level: Vcc2). In addition, the write row decoder 23 makes all of the word lines WL0 to WL(m-1) unselected (0 V) and puts the potential VPW in the p-well region 92 at 0 V. Moreover, the potential on the source line is put at 0 V. In the read operation, a signal WSG is set at the low ("L") level and VSGPW node is separated electrically from the select gate line.

The other operations are the same as explained in the first embodiment.

<Erase Operation>

Next, an erase operation will be explained. In an erase operation, all of the MOS transistors 16-0 to 16-3, 121-0 to 121-3, 131-0 to 131-3 are turned off. Then, the write row decoder 23 applies the negative voltage VBB to all of the word lines WL0 to WL(m-1). Furthermore, the write row decoder 23 applies the positive potential VPP to the p-well region 92. In the erase operation, the signals ZIOG, WSG are set at the low ("L") level.

As a result, electrons are pulled out of the floating gates of the memory cell transistors in the memory cells MC into the p-well region 92 by FN tunneling. As a result, the data in all of the memory cells MC are erased, which makes the threshold voltage negative. The potential on the select gate line rises to almost VPP by coupling with the p-well region 92. Of course, the negative voltage VBB may be applied from VSGPW node to the select gate lines SG0 to SG(m-1).

As described above, the first to fourth embodiments can be applied to the configuration where the row decoder is divided into a write row decoder and a read row decoder.

Figure 24:
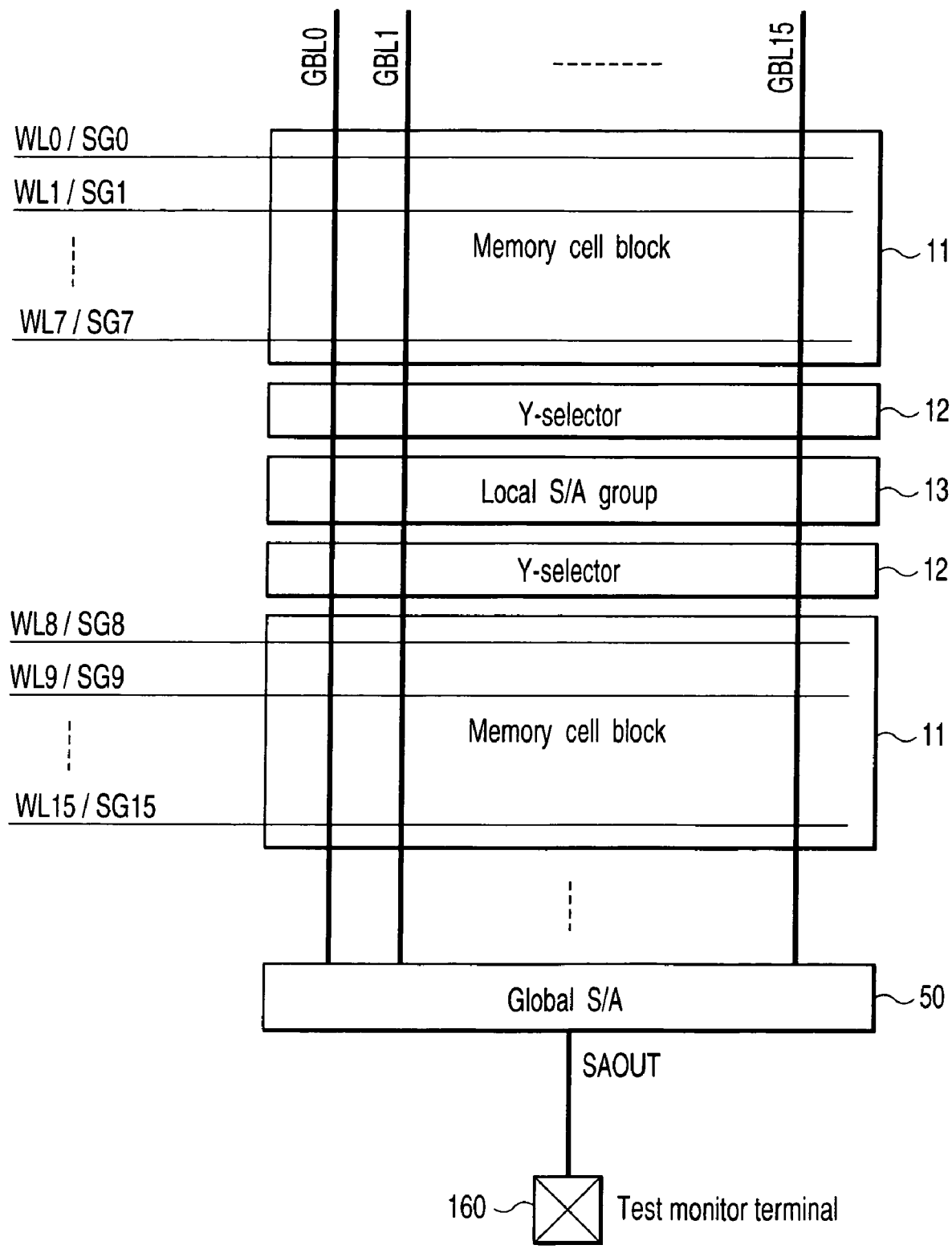
FIG. 24 is a block diagram of a part of a memory cell array including in a 2Tr flash memory according to a sixth embodiment of the present invention.

Next, a semiconductor memory device according to a sixth embodiment of the present invention will be explained. The sixth embodiment relates to a configuration for a test operation of an LSI according to the first to fifth embodiments. FIG. 24 is a block diagram of a part of the flash memory 3.

As shown in FIG. 24, the output node SAOUT of a global sense amplifier 50 is connected to a test monitor terminal 60. The test monitor terminal 60 is used to measure, for example, a cell current flowing in a memory cell MC in testing the operation of the flash memory 3.

The configuration of the sixth embodiment produces the effects explained in item (1) to item (5) explained in the first to fourth embodiments but also the effect in item (6) described below. (6) It is possible to simplify a test operation, while suppressing an increase in the area of the LSI.

When not only a global sense amplifier but also a local sense amplifier is used, a test operation is generally complicated as compared with a case where no local sense amplifier is used. The reason is that the local sense amplifier has a precharging function. For example, when a cell current is measured in a test operation, the global bit line cannot be used. Therefore, the local sense amplifier is provided with an external output transistor and external output metal wires. Using the transistor and metal wires, a test signal is input and output. Accordingly, a new circuit for a test is required, contributing to an increase in the area of the LSI.

With the configuration of the sixth embodiment, however, precharging is done by the global sense amplifier 50. Therefore, in a test operation, a test signal can be supplied and read using the global bit line. For example, when a cell current is read, the cell current is read to the test monitor terminal 60 via the Y-selector 12, local sense amplifier 17, and global bit line. That is, a test can be conducted using the same method as in an ordinary data read operation. Since a new circuit for a test need not be added, it is possible to simplify a test operation, while suppressing an increase in the area of the LSI.

Figure 25:
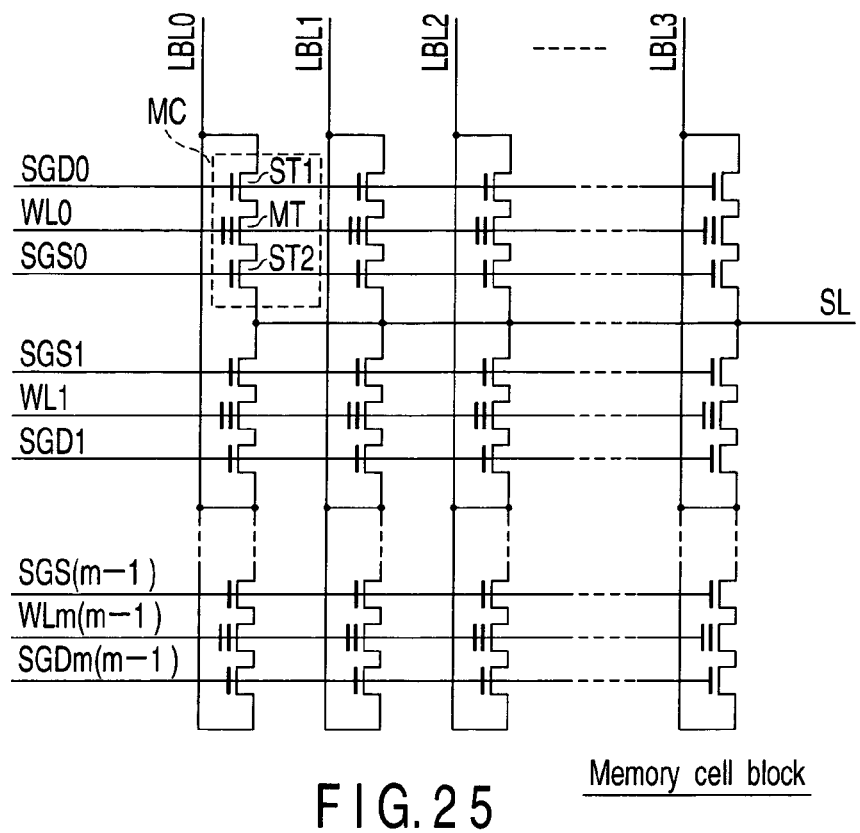
FIG. 25 is a circuit diagram of a memory cell block including in a flash memory according to a seventh embodiment of the present invention.

Now, description will be given of a semiconductor memory device according to a seventh embodiment of the present invention. The present embodiment corresponds to the first to sixth embodiments that use a 3Tr-NAND type flash memory in place of the 2Tr flash memory. FIG. 25 is a circuit diagram of the memory cell block 11 included in the 3Tr-NAND type flash memory. Since the structure is the same as first to sixth embodiments, except the configuration of the memory cell block, its explanation will be omitted.

As shown in the figure, the memory cell block 11 comprises (m×n) memory cells MC arranged in a matrix. Each of the memory cells has a memory cell transistor MT and select transistors ST1 and ST2 which have respective current paths connected in series. The current path in the memory cell transistor MT is connected between the current paths in the select transistors ST1 and ST2. The memory cell transistor MT comprises a stacked gate structure having a floating gate formed on the semiconductor substrate with a gate insulating film interposed therebetween and a control gate formed on the floating gate with an inter-gate insulating film interposed therebetween. Each of the select transistors ST1 and ST2 also has a multilayer gate structure including a first polycrystalline silicon layer formed on the semiconductor substrate with a gate insulating film interposed therebetween and a second polycrystalline silicon layer formed on the first polycrystalline silicon layer with a inter-gate insulating film interposed therebetween. The source region of the select transistor ST1 is connected to the drain region of the memory cell transistor MT. The source region of the memory cell transistor MT is connected to the drain region of the select transistor ST2. Further, the memory cells arranged adjacent to each other across the columns share the drain region of the select transistor ST1 or the source region of the select transistor ST2.

Each of the word lines WL0 to WL(m-1) connects commonly the control gates of the memory cell transistors MT in the same row. Each of the select gate lines SGD0 to SGD(m-1) connects commonly the gates of the select transistors ST1 in the same row. Each of the select gate lines SGS0 to SGS(m-1) connects commonly the gates of the select transistors ST2 in the same row. Each of the local bit lines LBL0 to LBL3 connects commonly the drain regions of the select transistors ST1 in the same column. The source line SL connects commonly the source regions of the select transistors ST2.

The first to sixth embodiments are applicable even to the above 3Tr-NAND type flash memory.

Figure 26:
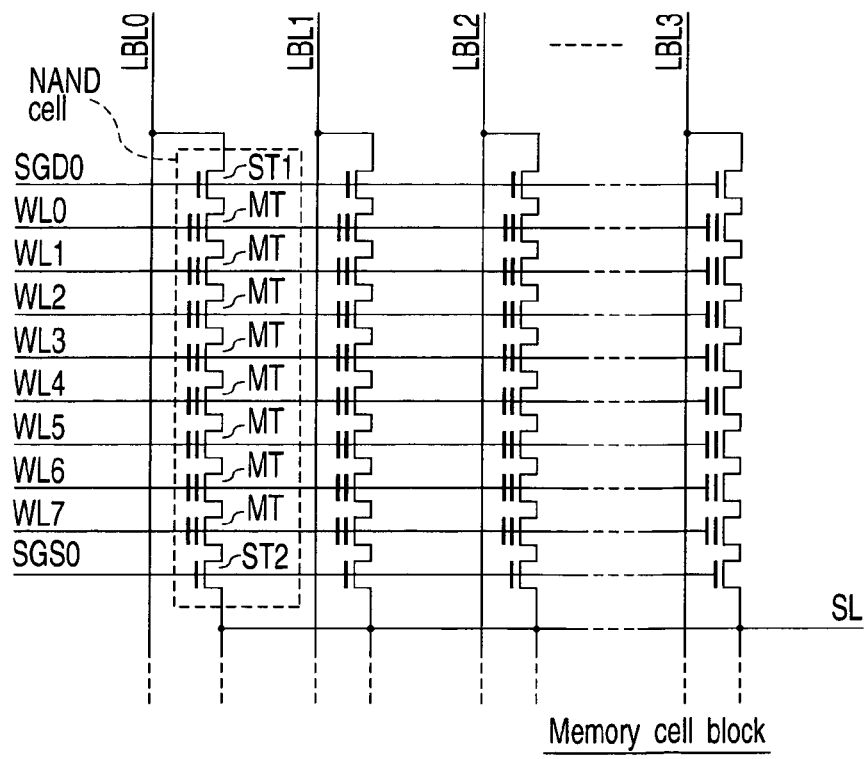
FIG. 26 is a circuit diagram of a memory cell block including in a flash memory according to an eighth embodiment of the present invention.

Now, description will be given of a semiconductor memory device according to a eighth embodiment of the present invention. The present embodiment corresponds to the first to sixth embodiments that use a NAND type flash memory in place of the 2Tr flash memory. FIG. 26 is a circuit diagram of a memory cell block included in the NAND type flash memory. Since the structure is the same as first to sixth embodiments, except the configuration of the memory cell block, its explanation will be omitted.

As shown in the figure, the memory cell block 11 comprises a plurality of NAND cells arranged in a matrix. Each of the NAND cells includes eight memory cell transistors MT and select transistors ST1 and ST2. The memory cell transistor MT comprises a stacked gate structure having a floating gate formed on the semiconductor substrate with a gate insulating film interposed therebetween and a control gate formed on the floating gate with an inter-gate insulating film interposed therebetween. The number of memory cell transistors MT is not limited to eight but may be 16 or 32. The number of memory cell transistor MT is not limited. The adjacent memory cell transistors MT share a source and a drain. Each memory cell transistor MT is placed between the select transistors ST1 and ST2 so that their current paths are connected in series. One end of the memory cell transistor MT, that is, its drain region, is connected to the source region of the select transistor ST1; the memory cell transistor MT is connected in series with the select transistors ST1 and ST2. The other end of the memory cell transistor MT, that is, its source region, is connected to the drain region of the select transistor ST2. That is, the NAND cell corresponds to the memory cell in the 3Tr-NAND type flash memory which has a plurality of memory cell transistors MT.

Each of the word lines WL0 to WL7 connects commonly the control gates of the memory cell transistors MT in the same row. The select gate lines SGD and SGS connect commonly the gates of the select transistors ST1 and ST2, respectively, in the same row. Further, each of the local bit lines BL0 to BL3 connects commonly the drain of the select transistors ST1 in the same column in the memory cell array. The sources of the select transistors ST2 are connected to the source line SL. Both the select transistors ST1 and ST2 are not required. Only one of the select transistors ST1 and ST2 may be provided if any of the NAND cells can be selected.

The first to sixth embodiments are applicable even to the above NAND type flash memory.

Figure 27:
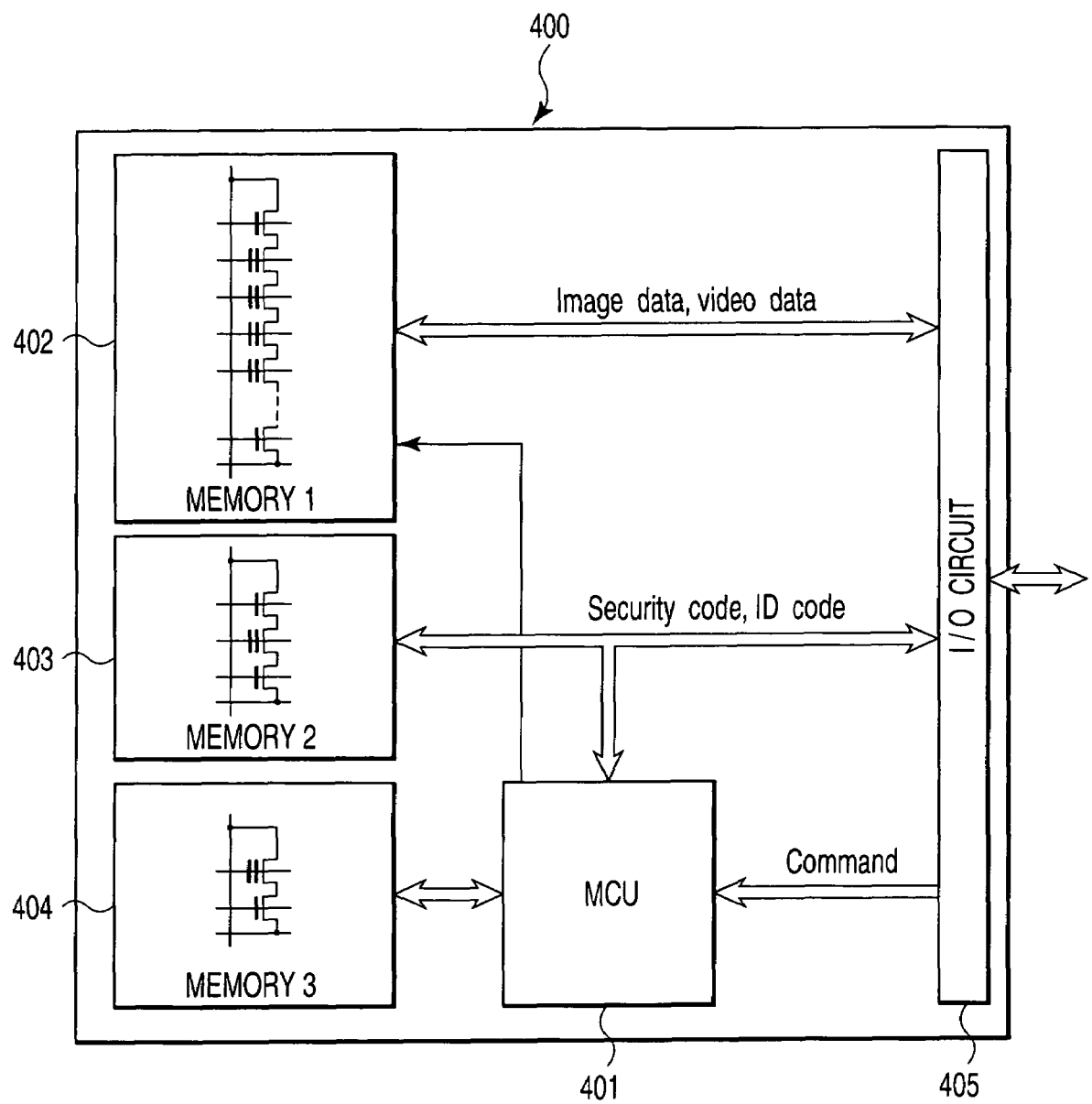
FIG. 27 is a block diagram of an LSI according to a ninth embodiment of the present invention.

Now, description will be given of a semiconductor memory device according to a ninth embodiment of the present invention. The present embodiment relates to a system LSI in which the flash memories described in the first to eighth embodiments are embedded to the same chip. FIG. 27 is a block diagram of the system LSI according to the present embodiment.

As shown in the figure, a system LSI 400 comprises MCU 401, an I/O circuit 405, and a NAND type flash memory 402, a 3Tr-NAND type flash memory 403, and a 2Tr flash memory 404 formed on the same semiconductor substrate.

The NAND type flash memory 402 is used as a storage memory to which image and video data are saved. The configuration of the NAND type flash memory 402 is as described in the eighth embodiment.

The 3Tr-NAND type flash memory 403 retains an ID or security code required to access the LSI 400. The configuration of the 3Tr-NAND type flash memory 403 is as described in the seventh embodiment.

The 2Tr flash memory 404 retains program data required to operate MCU 401. The configuration of the 2Tr flash memory 404 is as described in the first to sixth embodiments.

In response to various externally input commands, MCU 401 executes processes based on programs read from the 2Tr flash memory. On this occasion, MCU 401 directly accesses the 2Tr flash memory 404 without using SRAM (Static Random Access Memory) or the like. Examples of processes executed by MCU 401 include compression and decompression of data input to the NAND type flash memory 404 and control of an external device. Moreover, if the data held in the NAND type flash memory 402 is externally accessed, MCU 401 reads predetermined data from the 3Tr-NAND type flash memory 403. MCU 401 then checks the read data against an externally input ID or security code. If the data matches the ID or security code, MCU 401 permits an access to the NAND type flash memory 402. When the access to the NAND type flash memory 402 is permitted, the data in the NAND type flash memory 402 is externally accessed (by a host). That is, in response to an externally received command, MCU 401 triggers the NAND type flash memory 402 to read (write) data.

The I/O circuit 405 controls the transmission of signals between LSI 400 and an external device.

For the system LSI 400, configured as described above, it is possible to form, during the same step, the memory cell transistors MT and select transistors ST1, ST2, and ST provided in the NAND type flash memory 402, 3Tr-NAND type flash memory 403, and 2Tr flash memory 404. That is, the MOS transistors are formed by the same oxidation step, deposition step, impurity injection step, and photolithography etching step. As a result, the three flash memories 402 to 404 have the same gate insulating films, the same inter-gate insulating films, the same floating and control gates of the memory cell transistors MT, and the same select gates of the select transistors. This manufacturing method enables the memory cell arrays in the three flash memories to be formed using a number of steps required to form one flash memory.

The 2Tr flash memory 404 uses a positive voltage and a negative voltage for the read and erase operations. The MOS transistor used for the row decoder provided in the 2Tr flash memory 404 may have a thinner gate insulating film than the MOS transistor used for the row decoder provided in the NAND type flash memory 402 or 3Tr-NAND type flash memory 403. This makes it possible to reduce the size of the row decoder in the 2Tr flash memory, while increasing its operation speed.

The 2Tr flash memory 404 retains program data required to operate MCU 401. As described above, the 2Tr flash memory 404 operates at high speed. Accordingly, MCU 401 can read data directly from the 2Tr flash memory 404 without using RAM or the like. This eliminates the need for RAM or the like, thus simplifying the configuration of the system LSI. The operation speed can also be increased.

The 3Tr-NAND type flash memory 403 retains the ID or security code. The code data does not have a large data volume but is frequently changed or updated. Accordingly, the memory retaining the code data must operate somewhat fast. In this regard, the 3Tr-NAND type flash memory 403 uses a smaller erase unit than the NAND type flash memory 402. The 3Tr-NAND type flash memory 403 enables data to be rewritten page by page. Therefore, the 3Tr-NAND type flash memory 403 is an optimum semiconductor memory for retaining the code data.

An LSI with a NAND type flash memory conventionally requires such a controller as described below in order to prevent a rewrite operation from concentrating on particular blocks. The controller converts an input address into a physical address and performs control such that if any block is defective, this block will no longer be used. However, the present embodiment does not require such a controller. This is because the 2Tr flash memory 404 may retain a firmware program that controls the blocks in the NAND type flash memory 402 so that MCU 401 can perform the above control. MCU 401 may perform this control in the intervals between operations that must intrinsically be performed by it (control of an external device and calculation of data input to the NAND type flash memory). Of course, if the amount of processing that must intrinsically be executed by MCU 401 is large compared to the level of capabilities of MCU 401, a hardware sequencer or the like may be provided to control the NAND flash memory 402.

As described above, in the semiconductor memory device and controlling method, the semiconductor memory device including local sense amplifier and global sense amplifier precharges the bit line using the global sense amplifier. Consequently, it is possible to precharge only the local bit line which needs to be precharged. Therefore, the power consumption of the semiconductor memory device can be reduced. The embodiments described above show the flash memory, but above embodiments can be applied to the semiconductor memory device, in general, which precharges and discharges the bit line to read data, for example, DRAM, MRAM, and Ferroelectric RAM.

Figure 28:
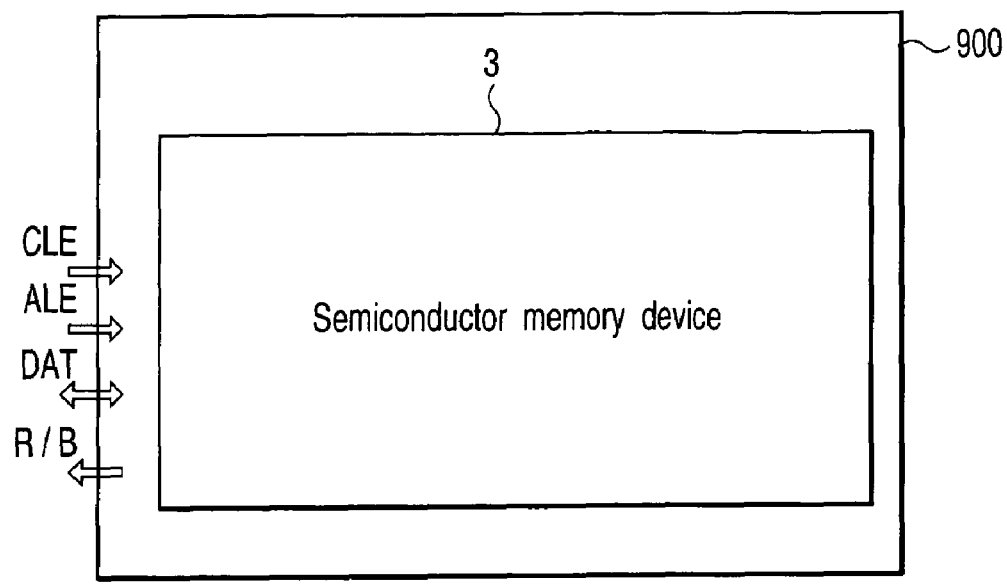
FIG. 28 is a block diagram of a memory card including a flash memory according to the first to eighth embodiments.

Next, an application of the flash memory will be explained. FIG. 28 shows an example of a memory card. As shown in FIG. 28, the memory card 900 includes a flash memory 3 (2Tr flash memory and 3Tr-NAND flash memory or NAND flash memory) explained in the above embodiments. The flash memory 3 receives specific controls signals and data from an external unit (not shown). In addition, the flash memory 3 outputs specific control signals and data to the external unit.

A signal line (DAT), a command line enable signal line (CLE), an address line enable signal line (ALE) and a ready/busy signal line (R/B) are connected to the memory card 900 having the flash memory 3. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device is ready, or not.

Figure 29:
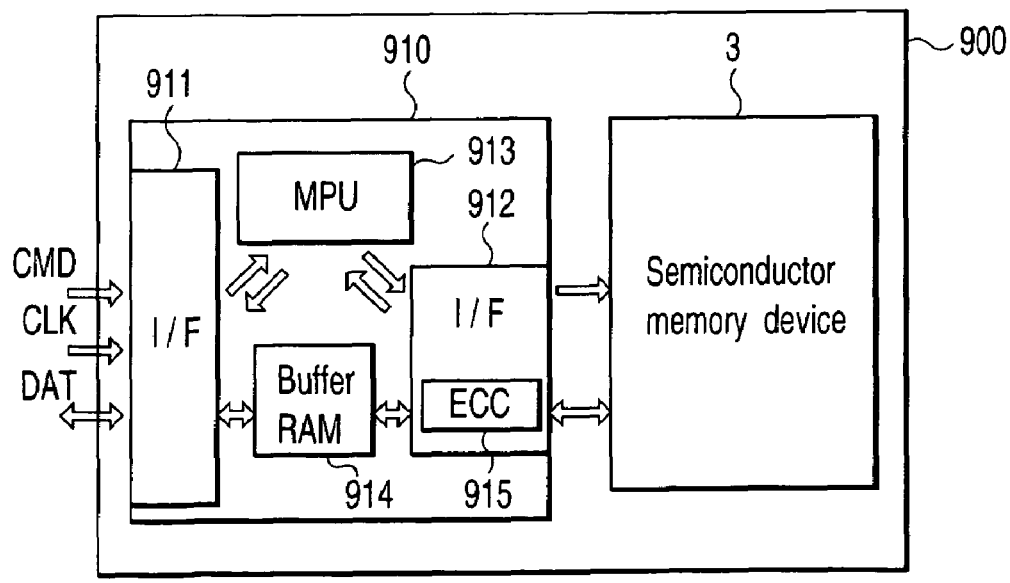
FIG. 29 is a block diagram of a memory card including a flash memory according to the first to eighth embodiments.

Another exemplary implementation is shown in FIG. 29. The memory card shown in FIG. 29 differs from the memory card presented in FIG. 28 in that the memory card of FIG. 29 includes, in addition to the memory device, a controller 910 which controls the flash memory 3 and receives/transfers predetermined signals from/to an external device (not shown).

The controller 910 includes interface units (I/F) 911, 912, a microprocessor unit (MPU) 913, a buffer RAM 914 and an error correction code unit (ECC) 915. The interface units (I/F) 911, 912 receives/outputs predetermined signals from/to an external device (not shown). The microprocessor unit 913 converts a logical address into a physical address. The buffer RAM 914 stores data temporarily. The error correction code unit 915 generates an error correction code. A command signal line (CMD), a clock signal line (CLK) and a signal line (DAT) are connected to the memory card 900. It should be noted that the number of the control signal lines, bit width of the signal line (DAT) and a circuit construction of the controller could be modified suitably.

Figure 30:
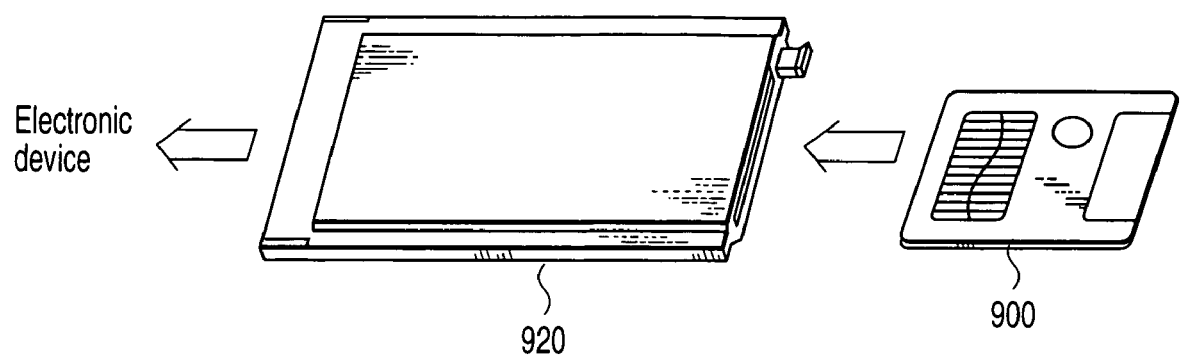
FIG. 30 is an external view of a memory card including a flash memory according to the first to eighth embodiments and a card holder.

FIG. 30 shows another application. As shown in FIG. 30, the memory card 900 is inserted into a cardholder 920, which is then connected to electronic equipment (not shown). The cardholder 920 may have a part of the function of the controller 910.

Figure 31:
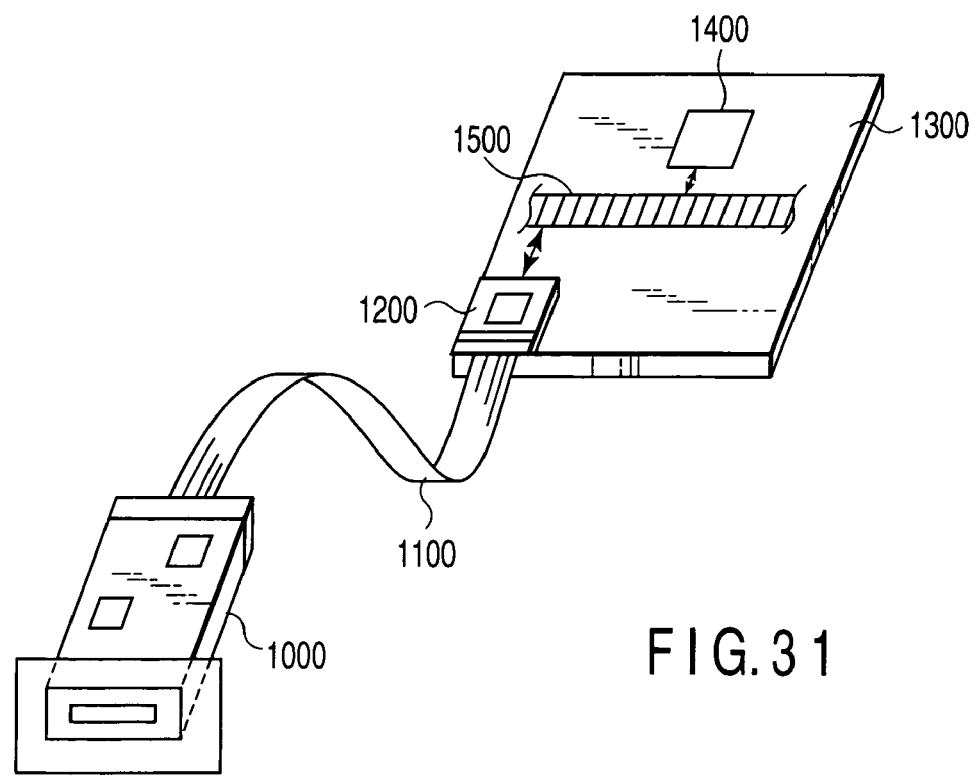
FIG. 31 is an external view of a connector unit to which a memory card including a flash memory according to the first to eighth embodiments is connected.

FIG. 31 shows another application. As shown in FIG. 31, the memory card 900 or the cardholder 920 in which the memory card 900 has been inserted is inserted into a connection unit 1000. The connection unit 1000 is connected to a board 1300 via a connection cable 1100 and an interface circuit 1200. The board 1300 includes a CPU 1400 and a bus 1500.

Figure 32:
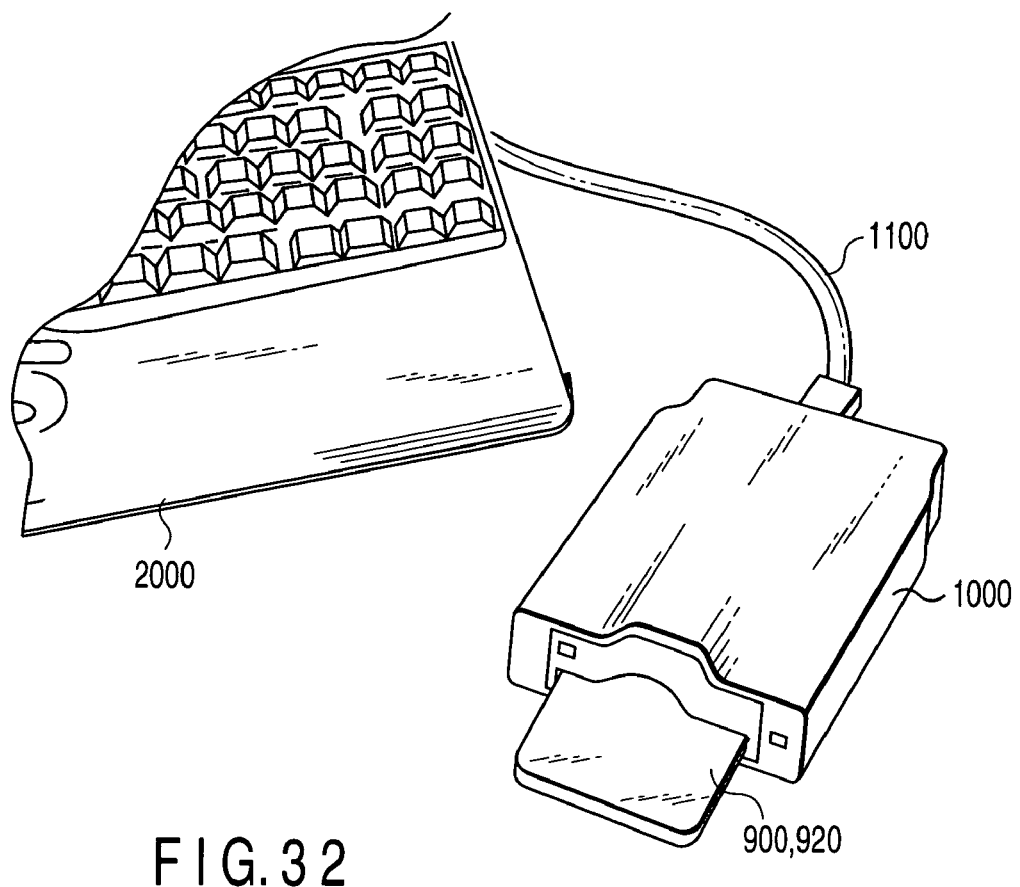
FIG. 32 is an external view of a connector unit to which a memory card including a flash memory according to the first to eighth embodiments is connected.

FIG. 32 shows another application. The memory card 900 or the cardholder 920 in which the memory card 900 has been inserted is inserted into the connection unit 1000. The connection unit 1000 is connected to a personal computer 2000 via the connection cable 1100.

Figure 33:
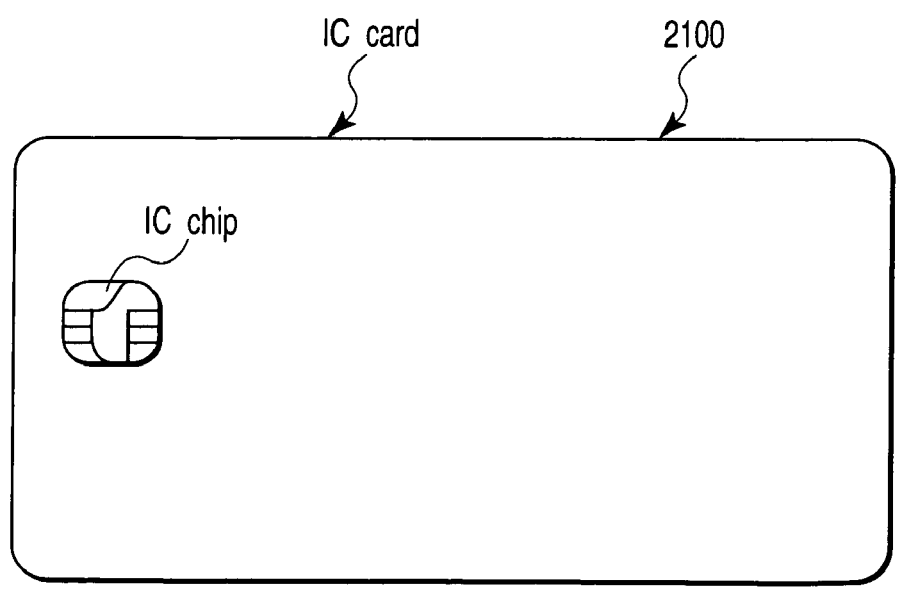
FIG. 33 is an external view of an IC card including a flash memory according to the first to eighth embodiments.
Figure 34:
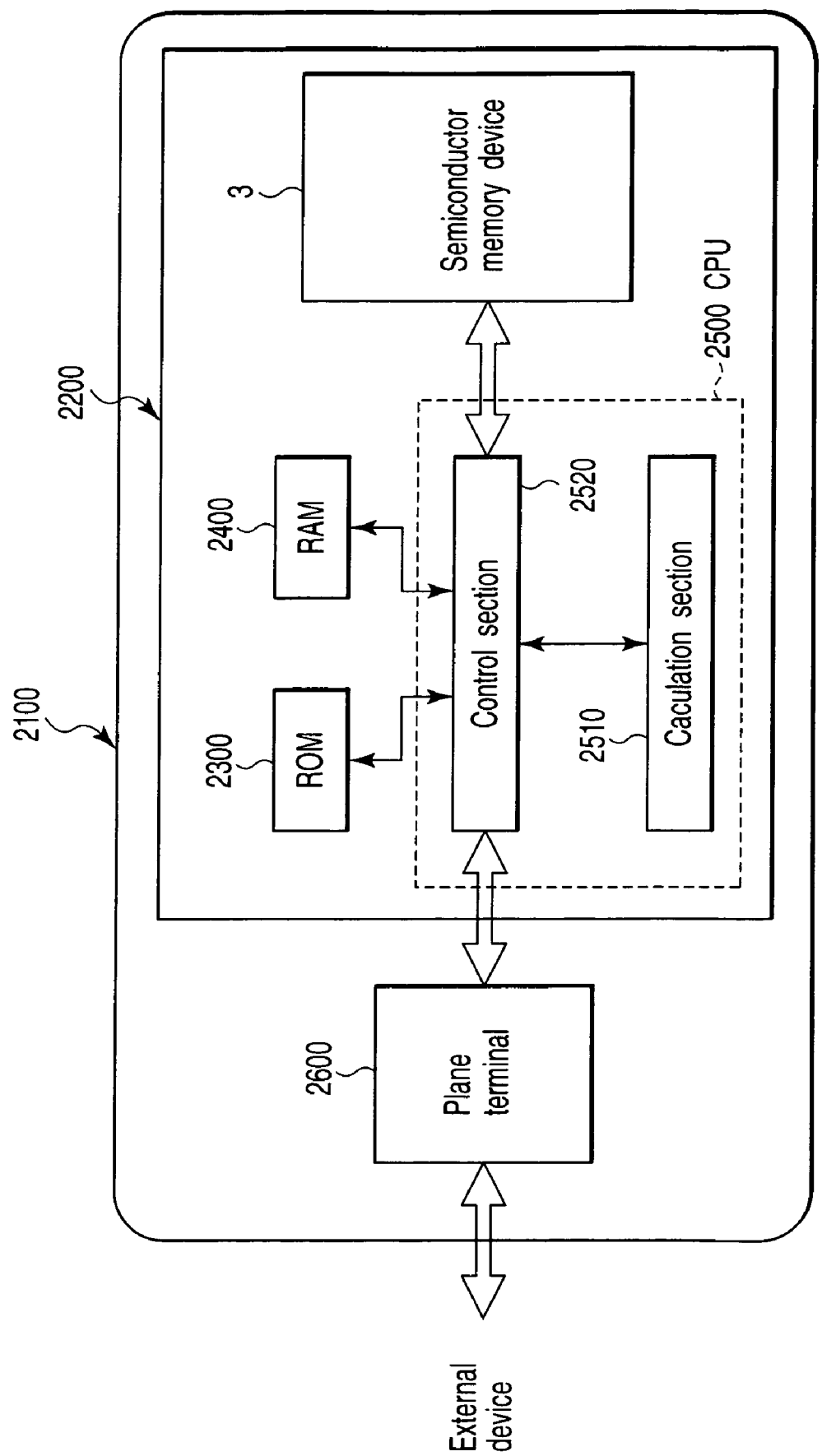
FIG. 34 is a block diagram of an IC card including a flash memory according to the first to eighth embodiments.

FIGS. 33 and 34 show another application. As shown in FIGS. 33 and 34, an IC card 2100 includes an MCU 2200. The MCU 2200 includes the flash memory 10 according to any one of the above embodiments, other circuits, including ROM 2300 and RAM 2400, and a CPU 2500. The IC card 2100 is connectable to the MCU 2200 via a plane connecting terminal 2600 connected to the MCU 2200 and provided on the IC card 2100. The CPU 2500 includes a computing section 2510 and a control section 2520 connected to the flash memory 3, ROM 2300, and RAM 2400. For example, the MPU 2200 is provided on one side of the IC card 2100 and the plane connecting terminal 2600 is provided on the other side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array in which memory cells are arranged;
   a plurality of first bit lines each of which connects commonly the memory cells;
   a second bit line which connects commonly two or more of the first bit lines;
   a first sense amplifier which is provided for the second bit line and which controls not only the connection between the second bit line and the first bit lines but also the potential on the second bit lines according to the data read from the memory cells onto the first bit lines;
   a second sense amplifier which precharges one of the first bit lines via the second bit line and the first sense amplifier and, when reading the data from the memory cells, amplifies the potential on the second bit line;
   word lines which connect commonly the memory cells;
   a row decoder which selects any one of the word lines in a read operation; and
   a sense amplifier control circuit which controls the operation of the first sense amplifier,
   wherein the row decoder and the sense amplifier control circuit are arranged so as to face each other in a direction along the word line, with the memory cell array being sandwiched between the row decoder and the sense amplifier control circuit,
   the first sense amplifier includes a first switch circuit which connects the second bit line to the first bit line according to control performed by the sense amplifier control circuit;
   a second switch circuit which connects the second bit line to the ground potential according to control performed by the sense amplifier control circuit and the potential on the first bit line; and
   a read control circuit which controls the operation of the second switch circuit according to the potential on the first bit line,
   the read control circuit includes a first inverter which has an input node connected to the first bit line and which inverts a potential on the first bit line,
   the second switch circuit includes a first MOS transistor one end of whose current path is connected to the second bit line, the other end of whose the current path is electrically connected to a ground potential and whose gate is connected to an output node of the first inverter
   the first switch circuit connects the second bit line to the first bit line while the first bit line is being precharged and disconnects the second bit line from the first bit line while data is being read from the memory cell according to a control by the sense amplifier control circuit, and
   the first inverter causes the first MOS transistor to have an ON state to connect the second bit line to the ground potential when "1" data is read from the memory cell.

2. The semiconductor memory device according to claim 1, wherein the second sense amplifier includes
   a precharge circuit which applies a precharge voltage to the second bit line,
   a third switch circuit which connects the second bit line to the precharge circuit,
   a second inverter which inverts the potential on the second bit line and controls the third switch circuit by the inverted signal, and
   a threshold control circuit which controls the threshold value of the second inverter.

3. The semiconductor memory device according to claim 2, wherein the second inverter includes a high-voltage-side power supply terminal and a low-voltage-side power supply terminal to which a high-voltage power supply and a low-voltage power supply to operate the second inverter are given respectively, and the threshold control circuit includes a diode connected between the low-voltage-side power supply terminal and a ground potential.

4. The semiconductor memory device according to claim 1, wherein the second switch circuit has a higher current driving capability than that of the memory cell.

5. The semiconductor memory device according to claim 1, wherein the first switch circuit includes a second MOS transistor one end of whose current path is connected to the second bit line, the other end of whose current path is connected to the first bit line, and whose gate is controlled by the sense amplifier control circuit, and the second switch circuit further includes a third MOS transistor one end of whose current path is connected to the other end of the current path of the first MOS transistor, the other end of whose current path is connected to the ground potential, and whose gate is controlled by the sense amplifier control circuit.

6. The device according to claim 1, further comprising:
a source line connected to the memory cells,
wherein each of the memory cells includes a memory cell transistor which has a drain region connected to the first bit line and a stacked gate including a charge accumulation layer formed on a semiconductor substrate with a gate insulating film interposed therebetween and a control gate formed on the charge accumulation layer with inter-gate insulating film interposed therebetween, the memory cell transistor being capable of storing a data; and
a select transistor which has a drain connected to a source of the memory cell transistor, a source connected to the source line and a gate,
in each of the memory cells, one select transistor is provided corresponding to one memory cell transistor.

7. The device according to claim 6, wherein the select transistor is caused to have an ON state when the data is read from the memory cell transistor, and to have an OFF state when the data is written to the memory cell transistor.

8. The device according to claim 1, wherein the first inverter includes a NOR gate to which the potential on the first bit line is input as input signals.

9. A semiconductor memory device comprising:
a memory cell array in which memory cells are arranged;
a plurality of first bit lines each of which connects commonly the memory cells;
a second bit line which connects commonly two or more of the first bit lines;
a first sense amplifier which is provided for the second bit line and which controls not only the connection between the second bit lines and the first bit lines but also the potential on the second bit lines according to the data read from the memory cells onto the first bit lines; and
a second sense amplifier which precharges one of the first bit lines via the second bit line and the first sense amplifiers and, when reading the data from the memory cells, amplifies the potential on the second bit line;
wherein the first sense amplifier includes,
a first switch circuit which connects the second bit line to the first bit line,
a second switch circuit which connects the second bit line to a ground potential, and
a read control circuit which controls the operation of the second switch circuit according to the potential on the first bit line, the read control circuit includes a first inverter which has an input node connected to the first bit line and which inverts a potential on the first bit line, the second switch circuit includes a first MOS transistor one end of whose current path is connected to the second bit line, the other end of whose the current path is electrically connected to a ground potential and whose gate is connected to an output node of the first inverter, the first switch circuit connects the second bit line to the first bit line while the first bit line is being precharged and disconnects the second bit line from the first bit line while data is being read from the memory cell, and the first inverter causes the first MOS transistor to have an ON state to connect the second bit line to the ground potential when "1" data is read from the memory cell.

10. The semiconductor memory device according to claim 9, wherein the second sense amplifier includes,
a precharge circuit which applies a precharge voltage to the second bit line,
a third switch circuit which connects the second bit line to the precharge circuit,
a second inverter which inverts the potential on the second bit line and controls the switch circuit by the inverted signal, and
a threshold control circuit which controls the threshold value of the second inverter.

11. The semiconductor memory device according to claim 10, wherein:
the second inverter includes a high-voltage-side power supply terminal and a low-voltage side power supply terminal to which a high-voltage power supply and a low-voltage power supply to operate the second inverter are given respectively; and
the threshold control circuit includes a diode connected between the low-voltage-side power supply terminal and a ground potential.

12. The semiconductor memory device according to claim 9, further comprising:
word lines which connect commonly the memory cells;
a row decoder which selects any one of the word lines in a read operation; and
a sense amplifier control circuit which controls the operation of the first sense amplifier;
wherein the row decoder and the sense amplifier control circuit are arranged so as to face each other in a direction along the word line, with the memory cell array being sandwiched between the row decoder and the sense amplifier control circuit.

13. The semiconductor memory device according to claim 9, wherein the second switch circuit has a higher current driving capability than that of the memory cell.

14. The semiconductor memory device according to claim 9, further comprising:
a sense amplifier control circuit which controls the operation of the first sense amplifier;
wherein the first switch circuit includes a second MOS transistor one end of whose current path is connected to the second bit line, the other end of whose current path is connected to the first bit line, and whose gate is controlled by the sense amplifier control circuit, the second switch circuit further includes a third MOS transistor one end of whose current path is connected to the other end of the current path of the first MOS transistor, the other end of whose current path is connected to the ground potential, and whose gate is controlled by the sense amplifier control circuit, and the row decoder and the sense amplifier control circuit are arranged so as to face each other in a direction along the word line, with the memory cell array being sandwiched between the row decoder and the sense amplifier control circuit.

15. The device according to claim 9, further comprising:
a source line connected to the memory cells,
wherein each of the memory cells includes a memory cell transistor which has a drain region connected to the first bit line and a stacked gate including a charge accumulation layer formed on a semiconductor substrate with a gate insulating film interposed therebetween and a control gate formed on the charge accumulation layer with inter-gate insulating film interposed therebetween, the memory cell transistor being capable of storing a data; and
a select transistor which has a drain connected to a source of the memory cell transistor, a source connected to the source line and a gate,
in each of the memory cells, one select transistor is provided corresponding to one memory cell transistor.

16. The device according to claim 15, wherein the select transistor is caused to have an ON state when the data is read from the memory cell transistor, and to have an OFF state when the data is written to the memory cell transistor.

17. The device according to claim 9, wherein the first inverter includes a NOR gate to which the potential on the first bit line is input as input signals.

18. A semiconductor memory device comprising:
a memory cell array in which memory cells are arranged;
a plurality of first bit lines each of which connects commonly the memory cells;
a second bit line which connects commonly two or more of the first bit lines;
a first sense amplifier which is provided for the second bit line and which controls not only the connection between the second bit line and the first bit lines but also the potential on the second bit line according to the data read from the memory cells onto the first bit lines; and
a second sense amplifier which precharges one of the first bit lines via the second bit line and the first sense amplifier and, when reading the data from the memory cells, amplifies the potential on the second bit line,
wherein the first sense amplifier includes a first MOS transistor which connects the second bit line to the first bit line;
a second MOS transistor which connects the second bit line to a ground potential; and
an inverter which has an input node connected to the first bit line and an output node connected to a gate of the second MOS transistor and which inverts a potential on the first bit line,
the first MOS transistor connects the second bit line to the first bit line while the first bit line is being precharged and disconnects the second bit line from the first bit line while data is being read from the memory cell, and
the inverter causes the second MOS transistor to have an ON state to connect the second bit line to the ground potential when "1" data is read from the memory cell.

19. The device according to claim 18, wherein the second MOS transistor has a higher current driving capability than that of the memory cell.

20. The device according to claim 18, further comprising:
a source line connected to the memory cells,
wherein each of the memory cells includes a memory cell transistor which has a drain region connected to the first bit line and a stacked gate including a charge accumulation layer formed on a semiconductor substrate with a gate insulating film interposed therebetween and a control gate formed on the charge accumulation layer with inter-gate insulating film interposed therebetween, the memory cell transistor being capable of storing a data; and
a select transistor which has a drain connected to a source of the memory cell transistor, a source connected to the source line and a gate,
wherein in each of the memory cells, one select transistor is provided corresponding to one memory cell transistor.

21. The device according to claim 20, wherein the select transistor is caused to have an ON state when the data is read from the memory cell transistor, and to have an OFF state when the data is written to the memory cell transistor.

22. The device according to claim 18, wherein the inverter includes a NOR gate to which the potential on the first bit line is input as input signals.

* * * * *